US008569099B2

(12) United States Patent
Sachs et al.

(10) Patent No.: US 8,569,099 B2
(45) Date of Patent: *Oct. 29, 2013

(54) ENHANCED METHODS FOR FABRICATING SOLAR CELLS WITH TEXTURED SURFACES

(75) Inventors: Emanuel M. Sachs, Newton, MA (US); James F. Bredt, Watertown, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/595,404

(22) Filed: Aug. 27, 2012

(65) Prior Publication Data

US 2013/0045561 A1     Feb. 21, 2013

Related U.S. Application Data

(63) Continuation of application No. 12/526,438, filed as application No. PCT/US2008/002058 on Feb. 15, 2008, now Pat. No. 8,257,998.

(60) Provisional application No. 60/901,511, filed on Feb. 15, 2007, provisional application No. 61/011,933, filed on Jan. 23, 2008.

(51) Int. Cl.
*H01L 21/00* (2006.01)

(52) U.S. Cl.
USPC .............. 438/71; 257/E31.13; 136/256

(58) Field of Classification Search
USPC .............. 438/71; 257/E31.13; 136/256
See application file for complete search history.

(56) References Cited

U.S. PATENT DOCUMENTS

| 3,676,732 A * | 7/1972 | Gabor .................. 315/10 |
| 3,985,579 A * | 10/1976 | Rahilly ................. 136/255 |
| 4,379,944 A * | 4/1983 | Borden et al. ......... 136/259 |
| 5,279,686 A * | 1/1994 | Nishida ................ 136/258 |

(Continued)

FOREIGN PATENT DOCUMENTS

| AU | 40395/85 | 3/1984 |
| CN | 175468 A | 3/2006 |
| CN | 1745468 A | 3/2006 |
| JP | 58-201377 | 11/1983 |
| JP | 08-191152 | 3/1984 |
| WO | 02/31892 A | 4/2002 |

OTHER PUBLICATIONS

Notification of Transmittal of The International Search Report and The Written Opinion of the International Searching Authority, PCT/US 08/02058, mailed May 22, 2008.

(Continued)

*Primary Examiner* — Jae Lee
*Assistant Examiner* — Grant Withers

(57) ABSTRACT

Semiconductor photovoltaic cells have surfaces that are textured for processing and photovoltaic reasons. The absorbing regions may have grooves that reduce loss of solar energy that would otherwise be lost by reflection. One form of texturing has grooves and ridges. The cell also includes metallizations for collecting generated electrical carriers and conducting them away, which may be channels. The topography is considered during production, using a process that takes advantage of the topography to govern what locations will receive a specific processing, and which locations will not. Liquids are treated directly into zones. They migrate throughout a zone and act upon the locations contacted. They do not migrate to other zones, due to impediments to flow, such as edges, walls and ridges. Liquid may also be deposited and migrate within a zone, to block or mask a subsequent activity, such as etching.

19 Claims, 31 Drawing Sheets

(56) References Cited

U.S. PATENT DOCUMENTS

| | | | | |
|---|---|---|---|---|
| 5,356,488 | A | * | 10/1994 | Hezel ........................... 136/256 |
| 5,994,641 | A | | 11/1999 | Kardauskas |
| 6,072,117 | A | * | 6/2000 | Matsuyama et al. .......... 136/256 |
| 6,156,968 | A | * | 12/2000 | Nishimoto et al. ........... 136/252 |
| 6,872,588 | B2 | | 3/2005 | Chabinyc et al. |
| 7,135,350 | B1 | | 11/2006 | Smith et al. |
| 2001/0017154 | A1 | * | 8/2001 | Washio ......................... 136/256 |
| 2004/0035460 | A1 | | 2/2004 | Gonsiorawski |
| 2004/0123897 | A1 | | 7/2004 | Ojima et al. |
| 2005/0230678 | A1 | * | 10/2005 | Cao et al. ....................... 257/40 |
| 2006/0151820 | A1 | | 7/2006 | Duan et al. |
| 2007/0204902 | A1 | * | 9/2007 | Dutta ........................... 136/256 |
| 2011/0045631 | A1 | * | 2/2011 | Ji et al. ............................ 438/98 |

OTHER PUBLICATIONS

1st OA for CN Patent App. No. 2008800117569, mailed Aug. 9, 2010, which also claims priority to PCT/US 08/02058.

2nd OA for CN Patent App. No. 20088001156.9, mailed Dec. 6, 2011, which also claims priority to PCT/US 08/02058.

3rd OA for CN Patent App. No. 20088001156.9, mailed Oct. 8, 2012, which also claims priority to PCT/US 08/02058.

Examination Report for Singapore Patent Application No. 200905447-9, mailed Jul. 9, 2010, which also claims priority to PCT/US 08/02058.

1st OA for JP Patent App. No. 2009549630, mailed Oct. 30, 2012, which also claims priority to PCT/US 08/02058.

* cited by examiner

ENHANCED METHODS FOR FABRICATING SOLAR CELLS WITH TEXTURED SURFACES

RELATED DOCUMENTS

This is a continuation application of co-pending U.S. patent application Ser. No. 12/526,438 entitled SOLAR CELLS WITH TEXTURED SURFACES (issuing on Sep. 4, 2012 as U.S. Pat. No. 8,257,998), which is the National Phase of Patent Cooperation Treaty application No. PCT/US2008/002058, of the same title, International filing date of Feb. 15, 2008. The PCT application and the application Ser. No. 12/526,438 both claim the benefit of U.S. Provisional application No. 60/901,511, filed on Feb. 15, 2007, entitled Solar Cell Light Trapping and Metallization Using Self-Aligning Mask, and U.S. Provisional application No. 61/011,933, filed on Jan. 23, 2008, entitled SOLAR CELL LIGHT TRAPPING AND METALLIZATION USING CAPILLARY ACTION TO DIRECT TREATMENT AND LOCATE SELF-ALIGNING MASKS ON BOTH FRONT AND BACK SURFACES. The benefit of each application mentioned above is hereby claimed and the entire disclosure of each application mentioned above is hereby incorporated fully herein, by reference.

INTRODUCTION

Inventions disclosed herein relate to an entirely new way of configuring and fabricating semiconductor photovoltaic cells. Cells according to inventions hereof have surfaces that are textured or shaped for various reasons, including to facilitate their manufacture, to increase their efficiency over that of cells having flat surfaces and to accommodate electrodes. The texturing in the absorbing regions reduces loss of solar energy that would otherwise be lost by reflection out of the cell, by capturing more light into the cell and by trapping the light within the cell. One form of texturing has parallel grooves and ridges. Another has pyramids; another, depressions. The cell also includes regions of metallization for collecting the generated electrical carriers and conducting them away.

Typical cells are fabricated in a series of steps that include doping the silicon to create p/n junctions, coating the cells with a layer that reduces reflection of light energy, referred to in the industry as an anti-reflective layer (referred to herein as an AR layer or coating), providing metallization, removing one or more layers in certain locations where they are not wanted, providing additional layers, either over the entire cell, or in selected locations, or both. Different steps of adding and removing material in specific locations may be conducted in different orders, depending on the specific needs of the process.

Typically, conducting these steps requires precisely identifying locations and regions upon the cell where a specific material needs to be added and/or removed, and then adding and/or removing material from the precise locations. Thus, the processes must be carefully controlled with regard to the locations on the cell, and the shape or geometry, including topography of the cell, at specific locations. As used herein, topography means the geographical features of height and depth relative to a nominal baseline or zero plane, at specific locations. Controlling such processes to a level of precision required for PV cells is challenging. It would be advantageous to enable an automatic or simplified method or methods of coordinating the addition and removal of material with the locations and topography of the cell.

Using present techniques, it is not possible to precisely locate materials to provide metallization, other than by using metal containing inks and some other less than optimal methods. For instance, it is not known how to provide an electroless plating catalyst in a localized region. Similarly, it is not known how to provide plating chemistries in a localized region. At present, it is not known how to locally remove the AR coating, which would be desirable to enhance adhesion between the metal and the underlying semiconductor. Typically, metallization, such as silver, must be provided over an anti-reflective coating, which metallization then reacts through the AR coating to make contact with the semiconductor underneath the coating. This process has inefficiencies associated with it.

Thus, it is desirable to provide a photovoltaic device that has a surface that is textured to provide a topography that reduces losses due to reflection, and other phenomena, which can be efficiently, economically and reliably fabricated. It is also desirable to provide a photovoltaic device that has higher efficiencies than those presently available, at substantially the same, or lower cost per unit of energy collected. It would also be desirable to develop methods of making such improved efficiency photovoltaic devices that are not impeded by any such texture, and, which in fact, may be enhanced by the presence of texture.

It would also be desirable to provide methods of placing metallization chemistry precisely and efficiently. It would further be desirable to provide methods for making electrical contact from the metallization to the semiconductor directly, without need to react through an antireflective layer.

BRIEF SUMMARY

A brief summary of inventions disclosed is presented here. A more detailed summary is presented below, immediately preceding the claims. Inventions disclosed herein include considering the topography of a workpiece at every stage along the way of production, and if possible, using a process that takes advantage of the topography to govern what locations upon the surface a semiconductor photovoltaic cell will receive a specific processing, and which locations will not receive such a treatment. As an example, a network of interconnected channels is provided, which network is surrounded by edges, and then other regions. One stage of a useful process is conducted with a liquid within the network of channels, and absent from the surrounding regions due to liquid flow impediments. An embodiment of an inventive process is conducted so that a liquid deposited within the network flows to locations where it is wanted, and avoids locations where it is not wanted. Thus, the topography of the workpiece, coupled with the choice of treatment to the workpiece, governs the effect of the step being conducted.

As a first example, it may be desired to deposit a liquid that will treat a region, for instance by electroless plating, yet leave other areas unplated. Thus, plating chemistry liquid can be provided in a portion of a zone and then allowed to flow such as by capillarity throughout the zone. The liquid deposited actively treats the zones it contacts, but there are zones of the workpiece from which the liquid is excluded and which it does not treat. As another example, it is desired to provide a mask to certain regions but not others of the workpiece. Mask material is applied to the workpiece in specific locations, from which locations the mask material migrates to the extent of the zones where it is desired to have a mask, but no further. The liquid migrates to specific locations due to topography of the workpiece and ceases migrating due to the topography. Masking operations are also referred to as blocking operations herein, because they block the regions processed from other active processes that affect un-blocked regions.

The driving force causing the liquid to migrate may be due at least in part to any one of: capillarity, gravity, acceleration due to vibration, sudden change in motion, or any other suitable force. These phenomena may be primarily responsible for migration or in concert with one or more other phenomena.

Other inventions disclosed herein relate specifically to the topography of a cell surface for purposes of reducing reflected light energy, methods of fabricating the topography of the light collecting regions, and methods of fabricating the topography of the current conducting regions of a cell. Additional inventions include methods of providing the metallization to the conductor regions, and more.

Solar cells of an invention hereof use a light-trapping surface texture that creates a directed capillary suction to facilitate further manufacturing steps, especially metallization of the front or back contacts or both. Regions where a manufacturing step requires masking have interconnected grooves that are topographically and hydraulically isolated from other regions of the wafer that are exposed during the manufacturing step.

Another invention hereof relates to reapplying a mask. Because the topography can direct where certain actions take place it is very convenient to mask the work-piece, conduct some steps, remove the mask, conduct other steps, and then without great difficulty, replace the mask in exactly the same location, and conduct yet more steps, over and over again.

These and other objects and aspects of inventions disclosed herein will be better understood with reference to the attached claims and the figures of the drawings, which are:

Figure 1:
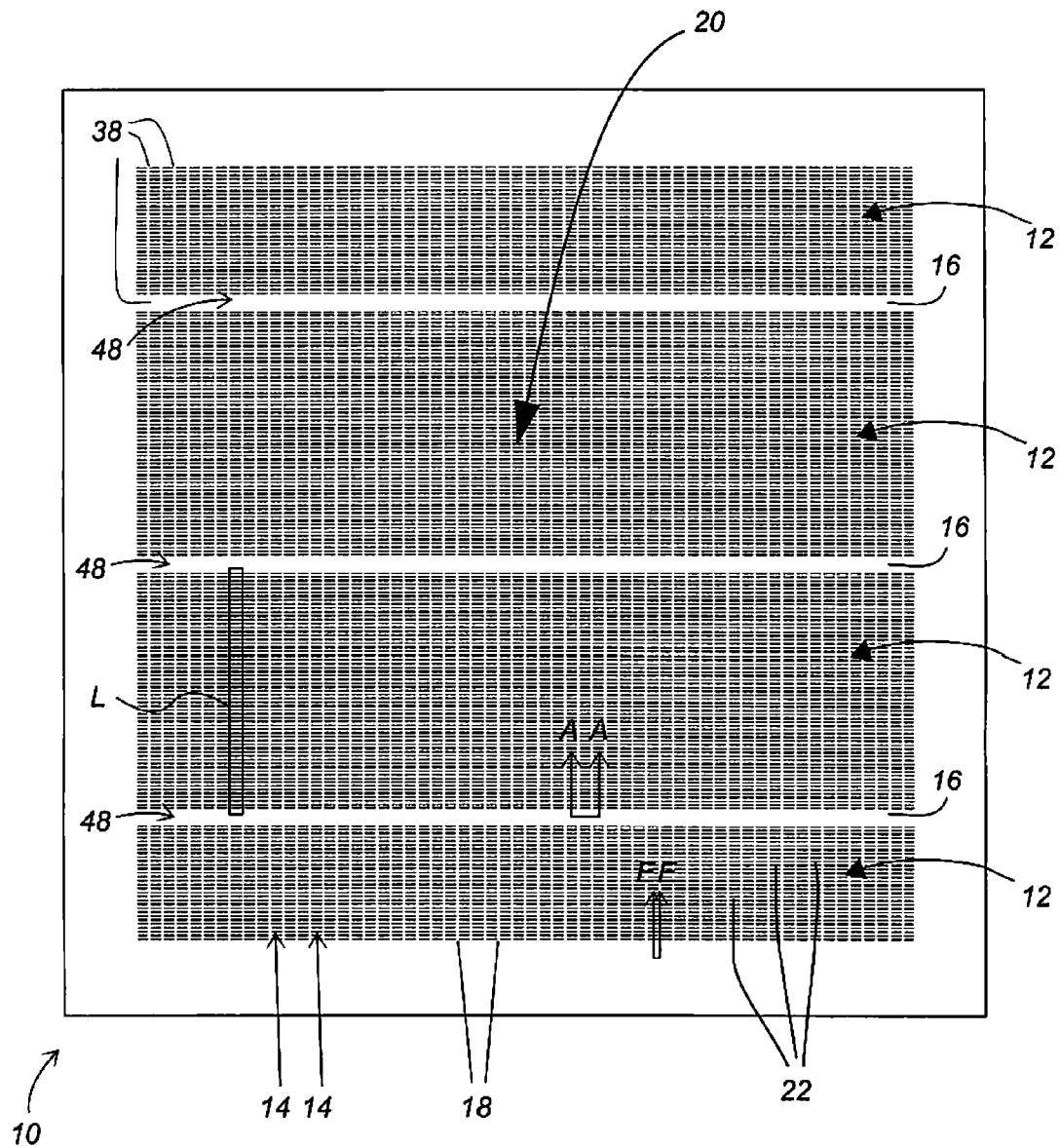
FIG. 1 is a schematic representation in plan view of a photovoltaic cell of an invention hereof.
Figure 4A:
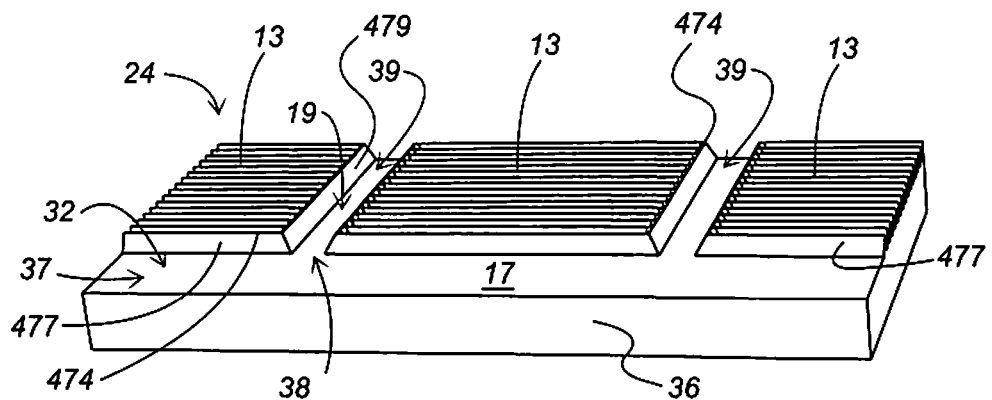
Figure 4B:
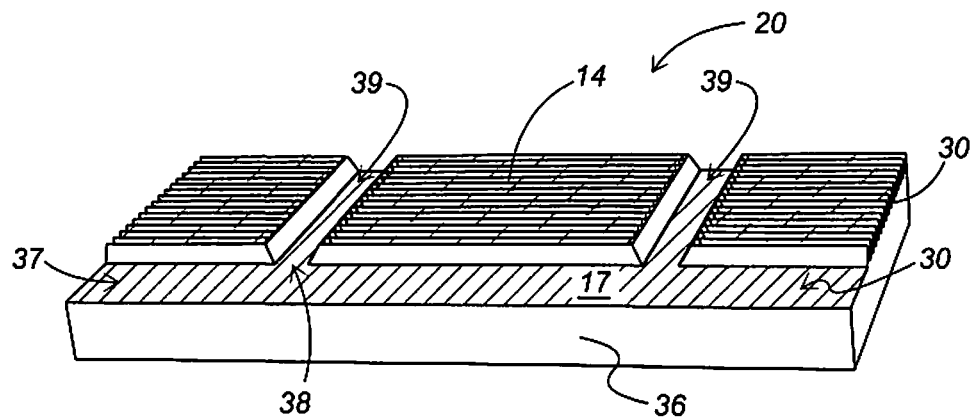
Figure 4C:
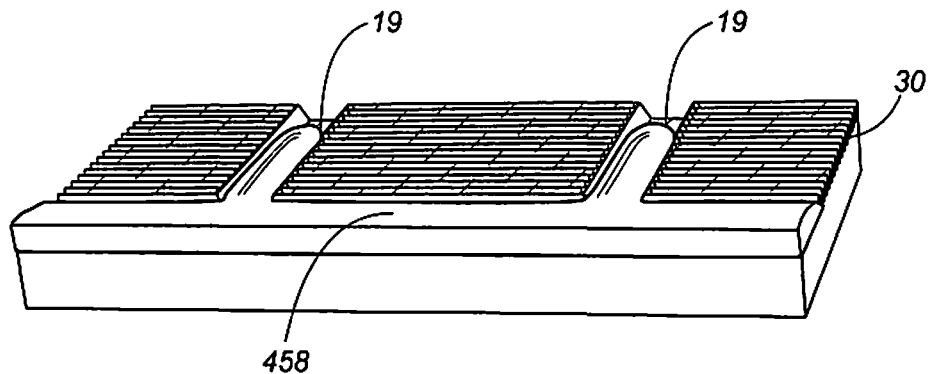
Figure 4D:
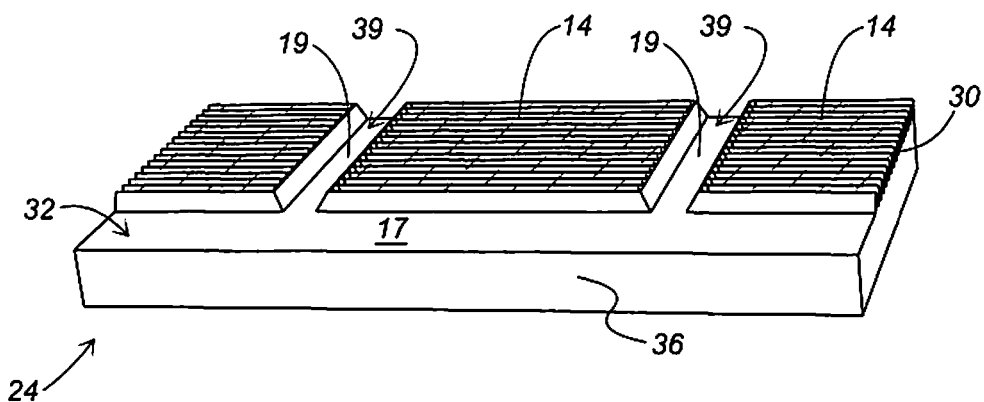
Figure 4E:
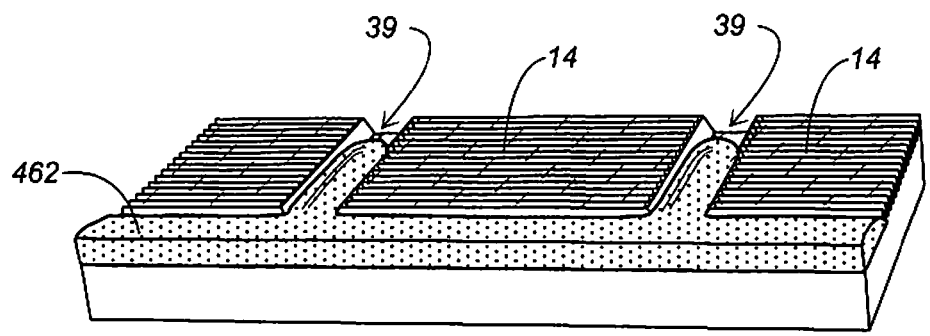
Figure 4F:
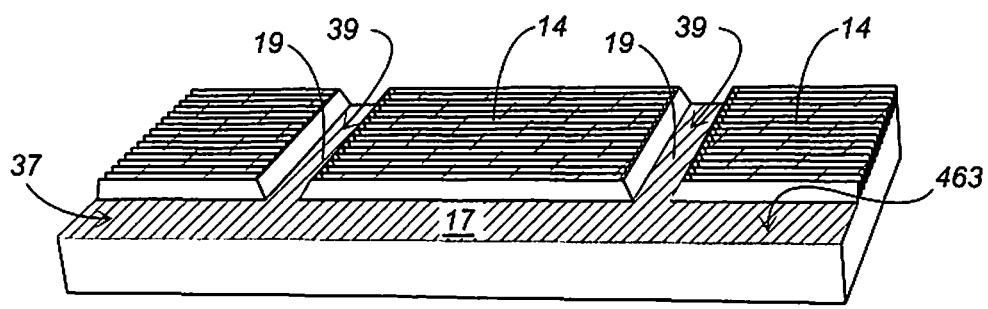
Figure 4G:
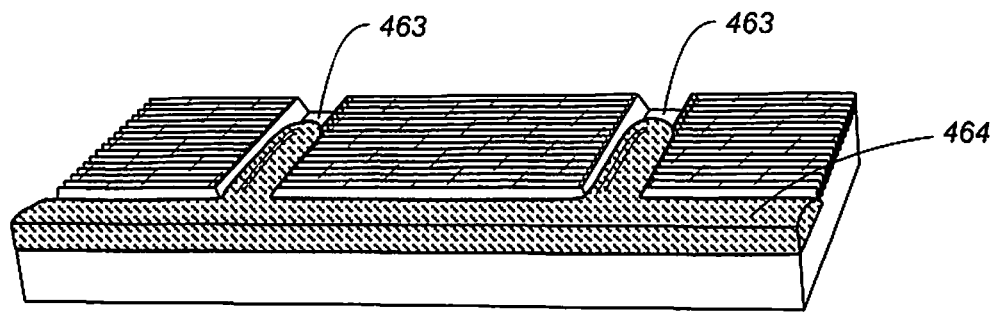
Figure 4H:
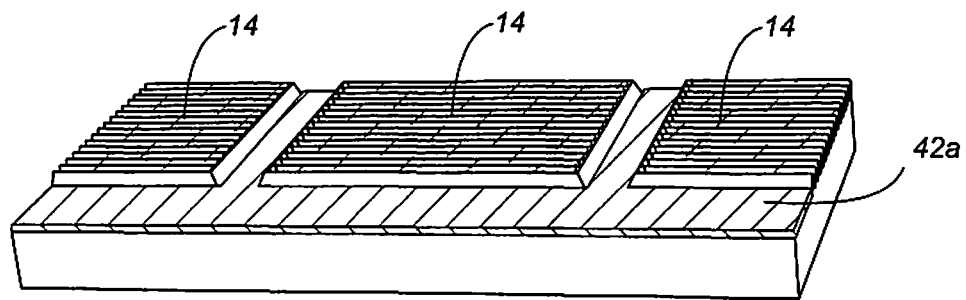
Figure 4I:
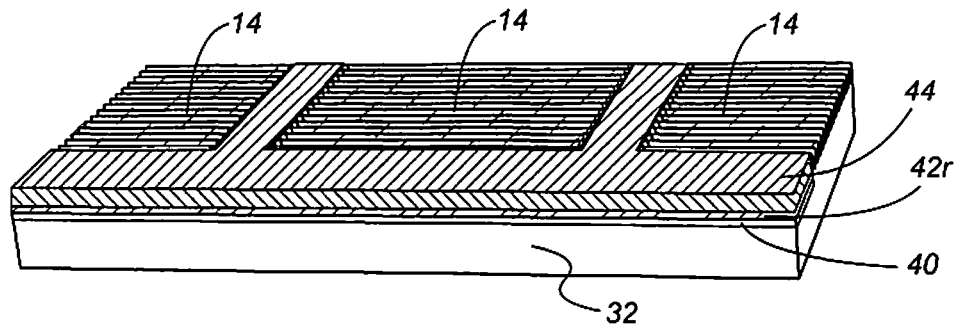
Figure 5:
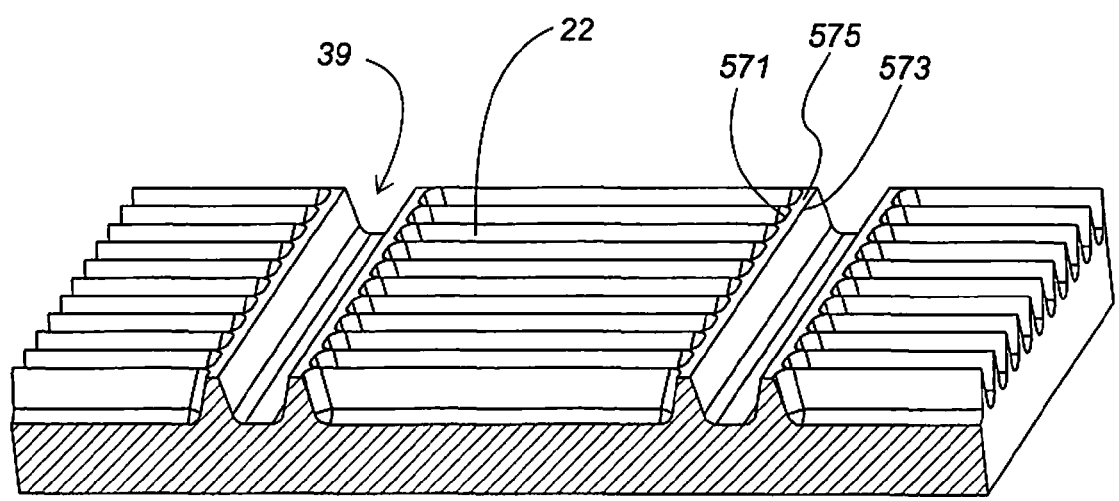
Figure 5A:
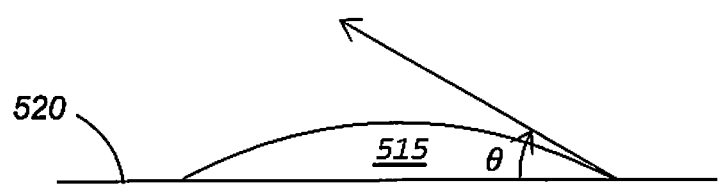
Figure 5B:
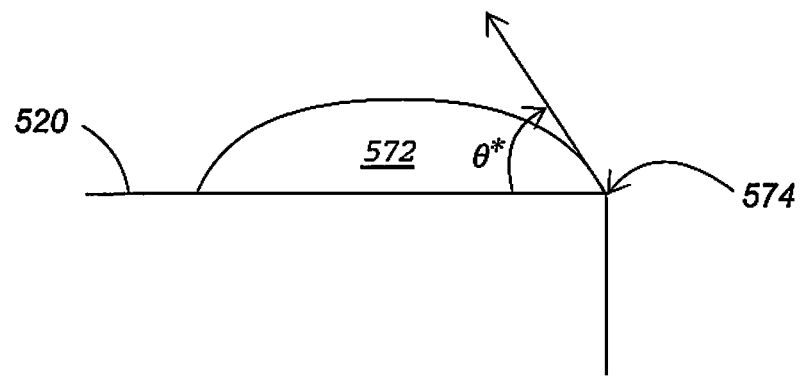
Figure 6A:
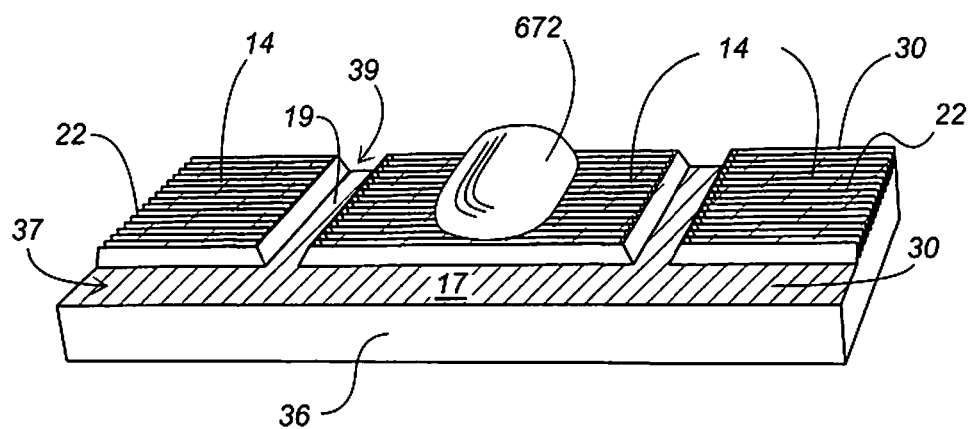
Figure 6B:
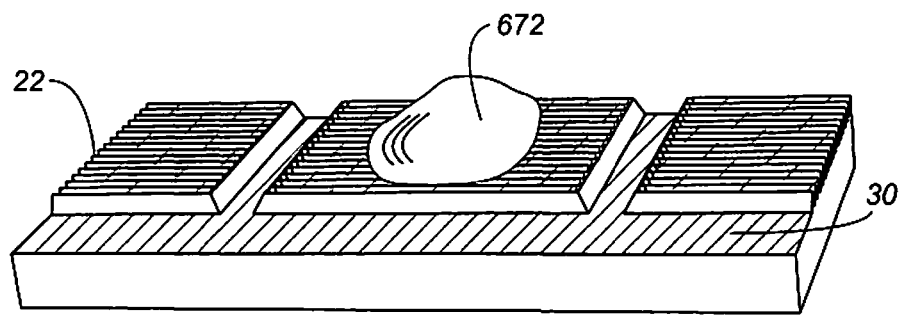
Figure 6C:
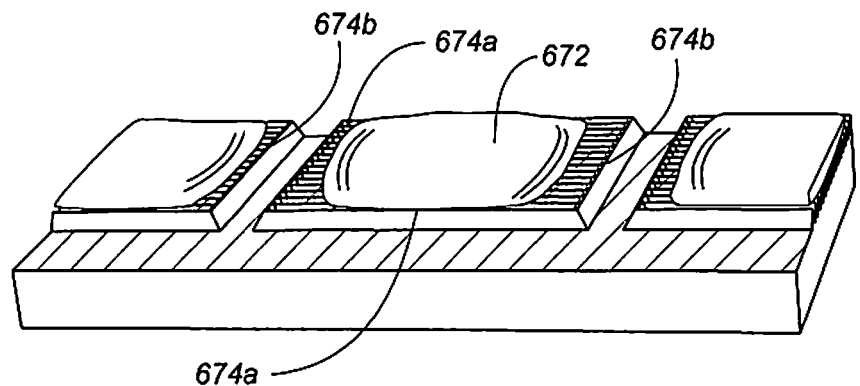
Figure 6D:
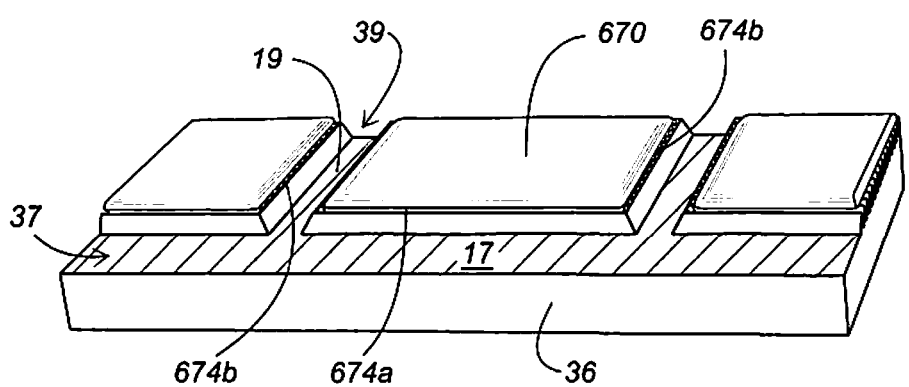
Figure 7A:
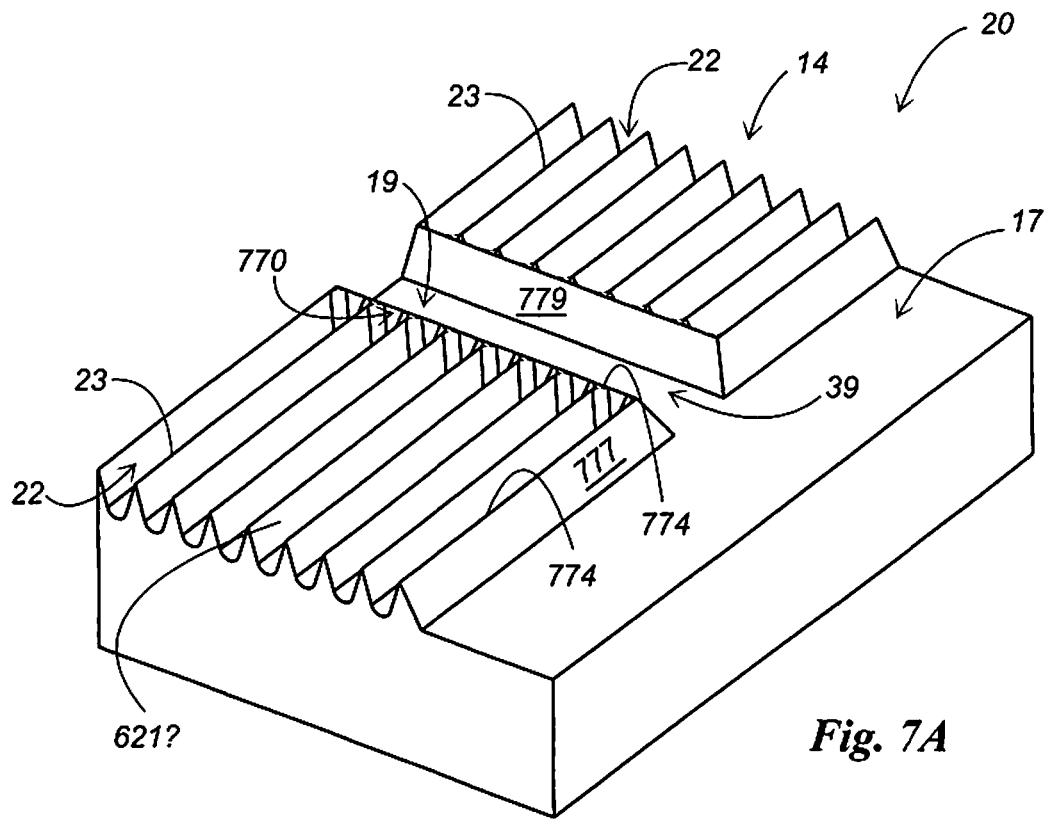
Figure 7B:
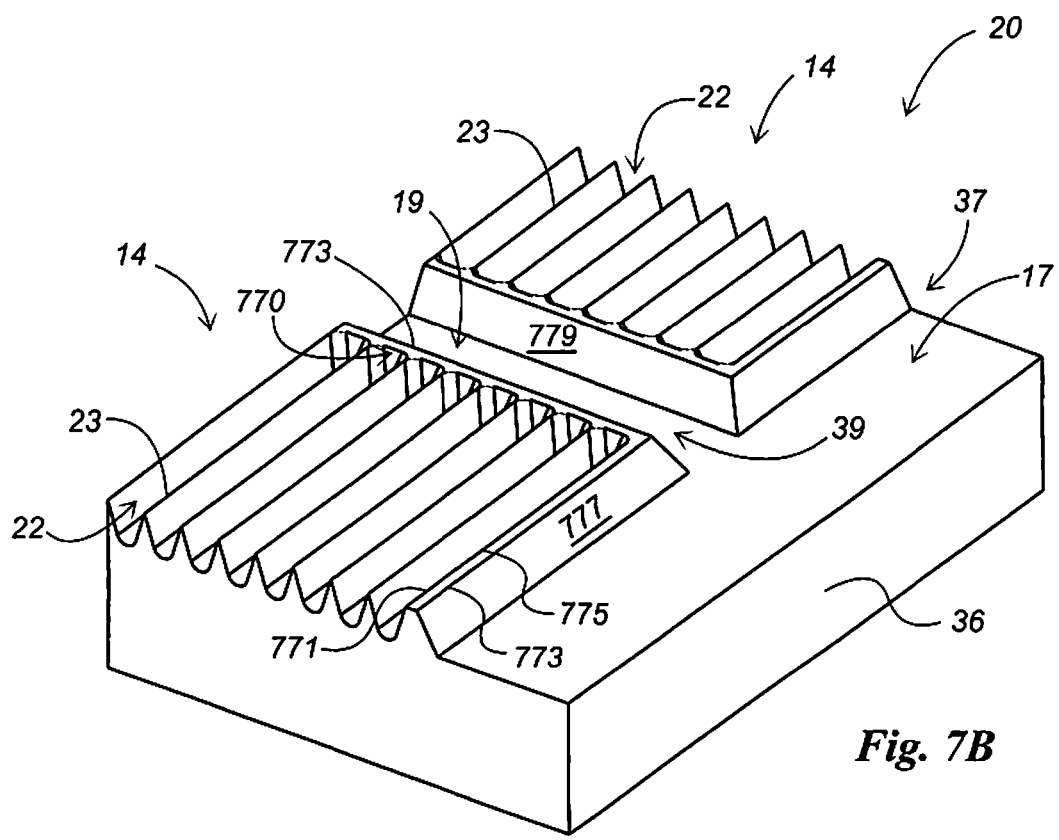
Figure 7C:
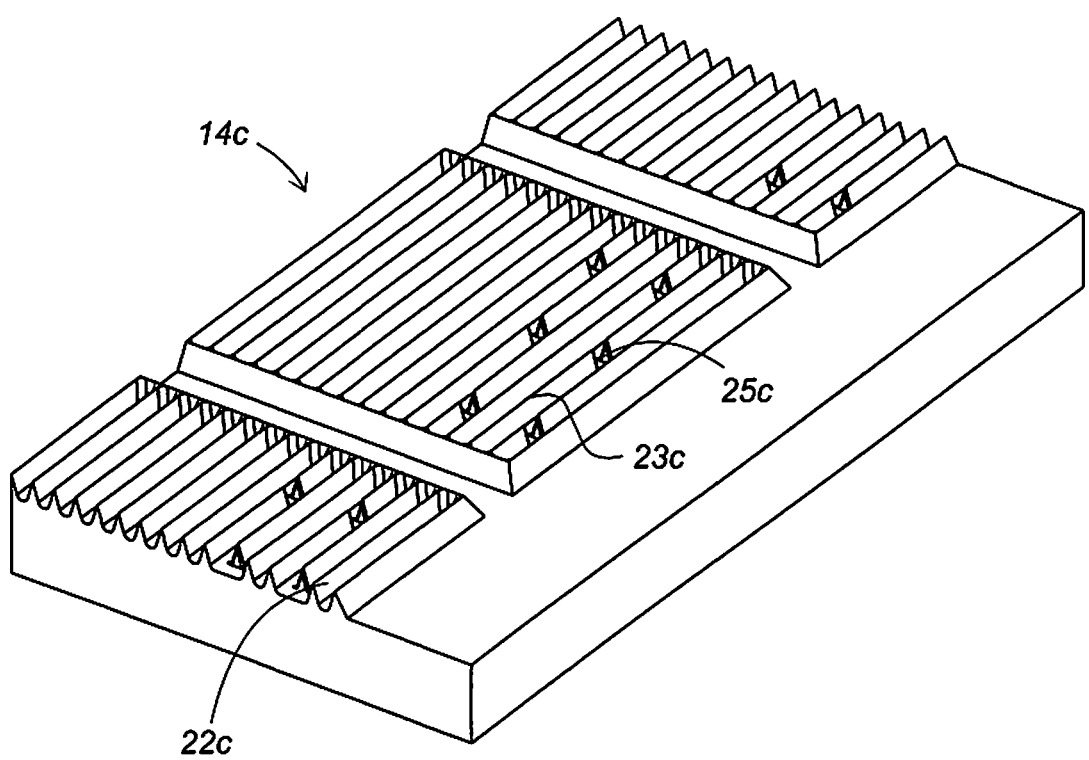
Figure 7D:
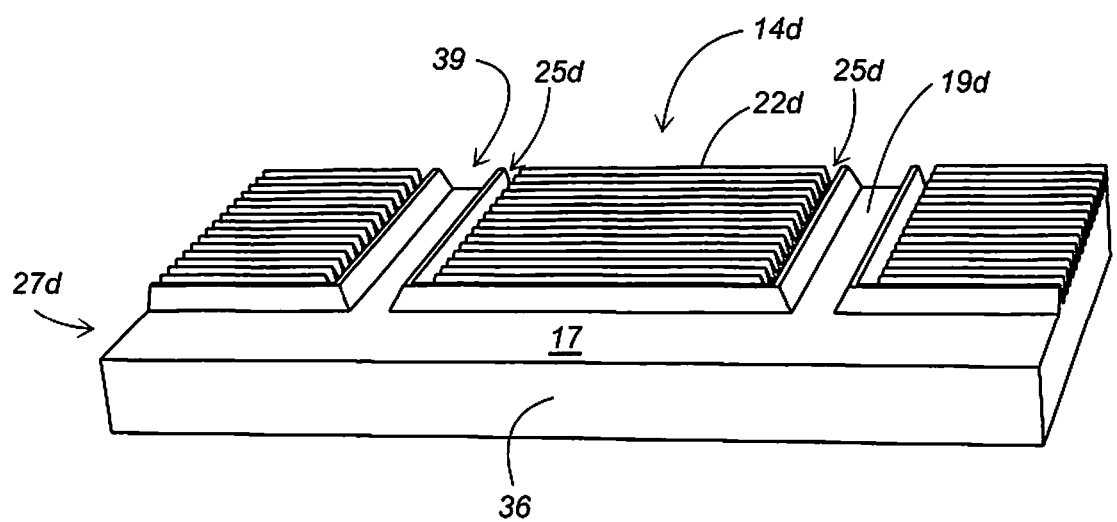
Figure 7E:
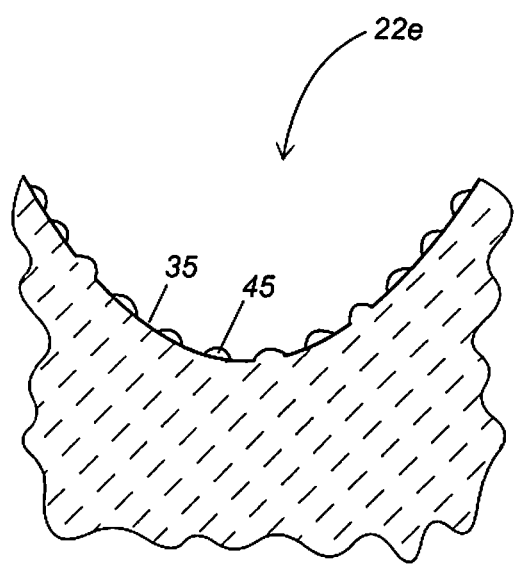
Figure 8A:
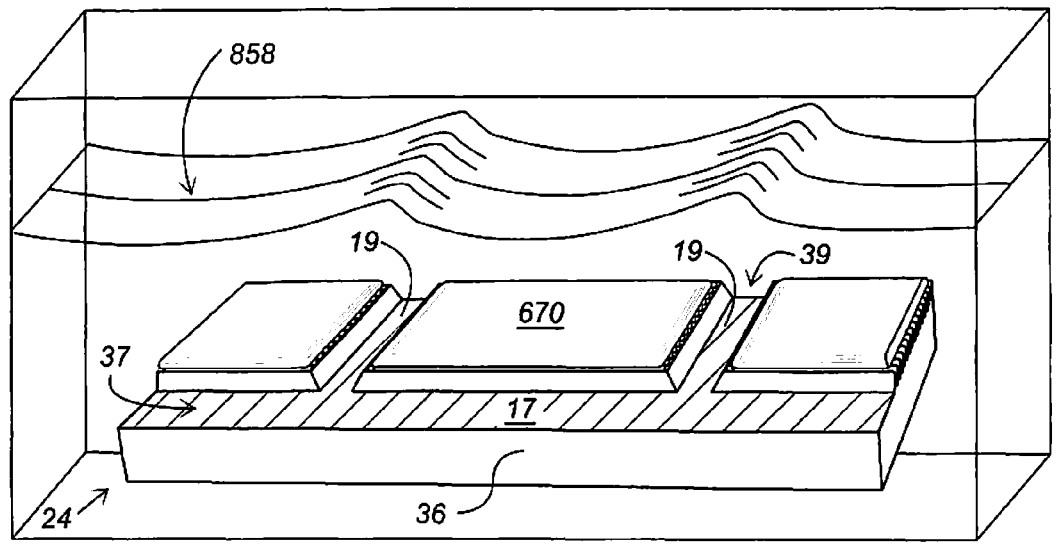
Figure 8B:
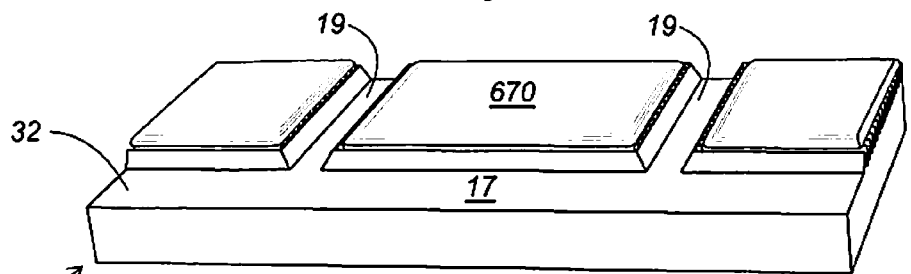
Figure 8C:
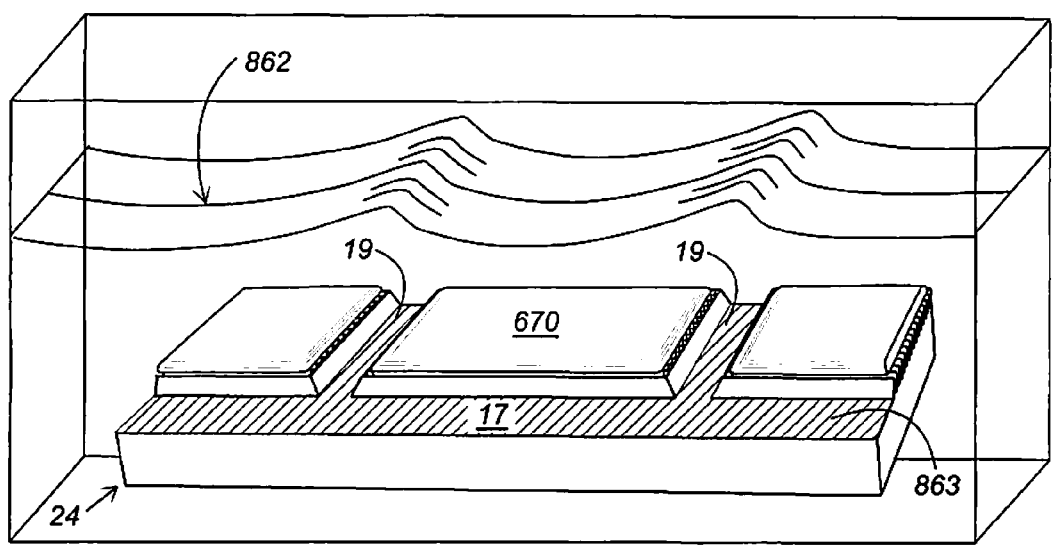
Figure 8D:
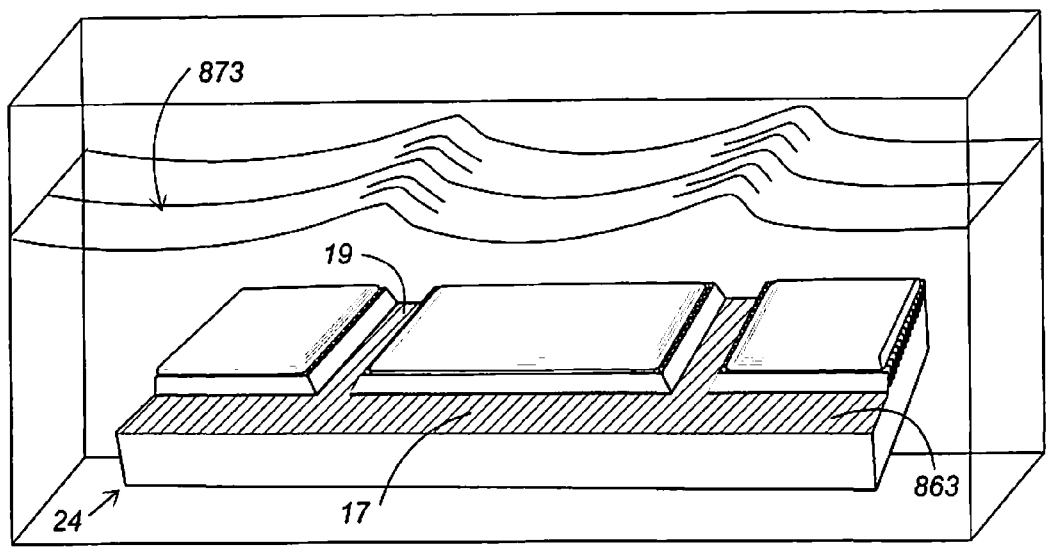
Figure 8E:
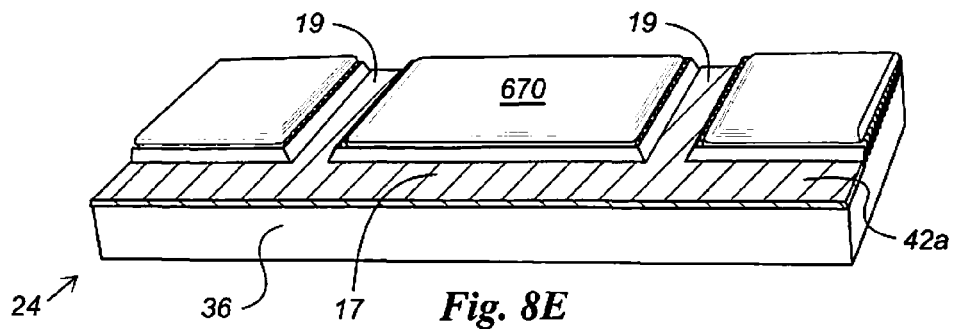
Figure 8F:
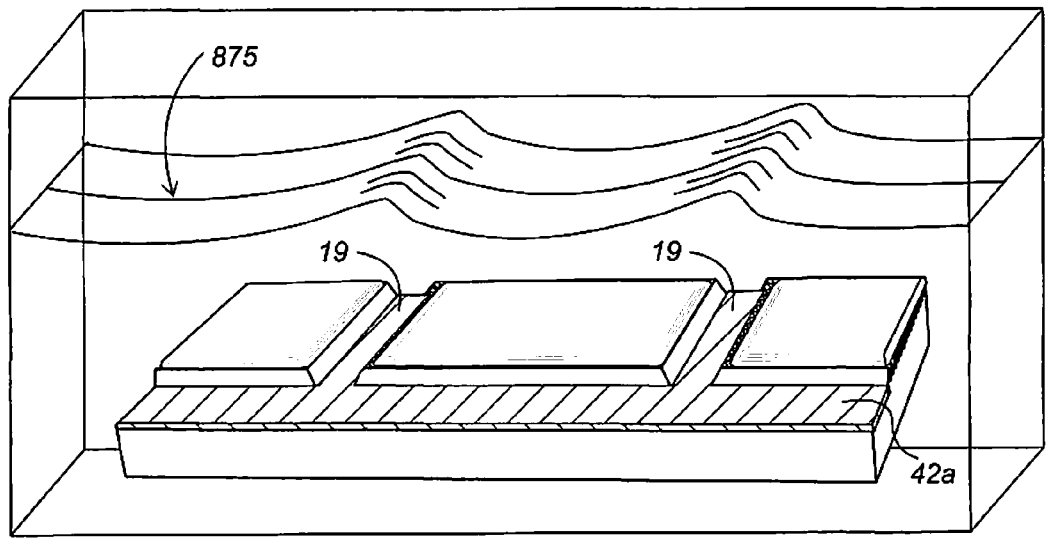
Figure 8G:
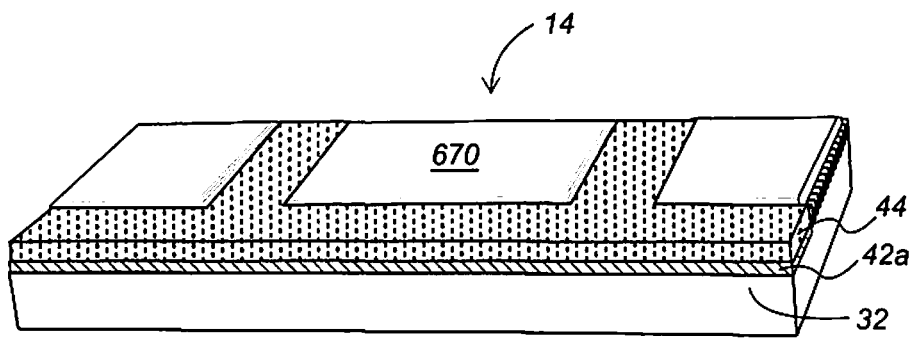
Figure 8H:
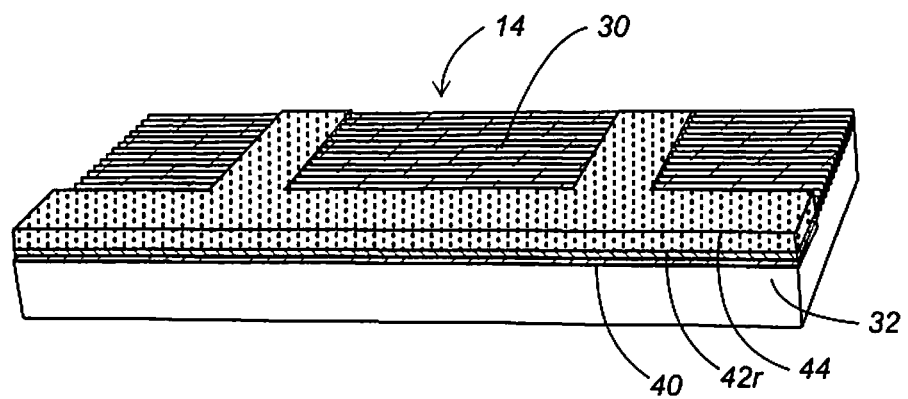
Figure 9A:
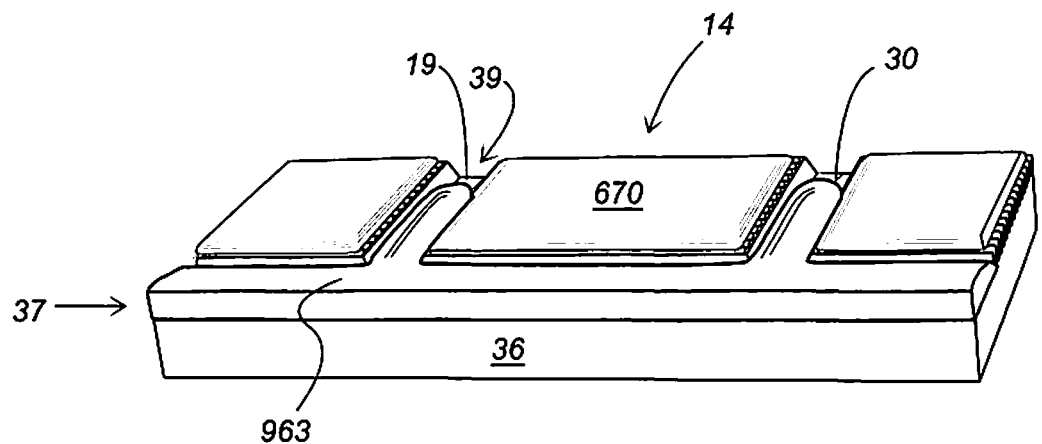
Figure 9B:
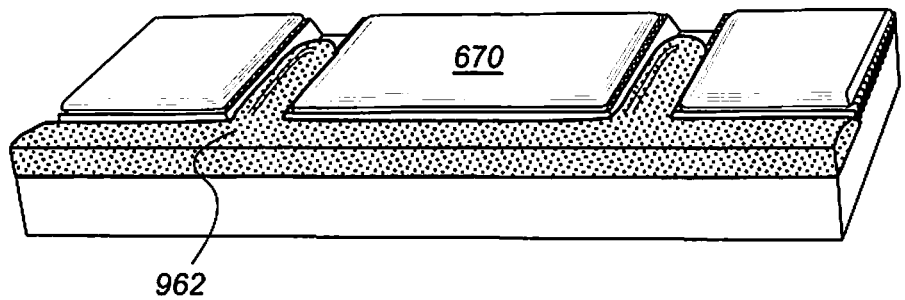
Figure 9C:
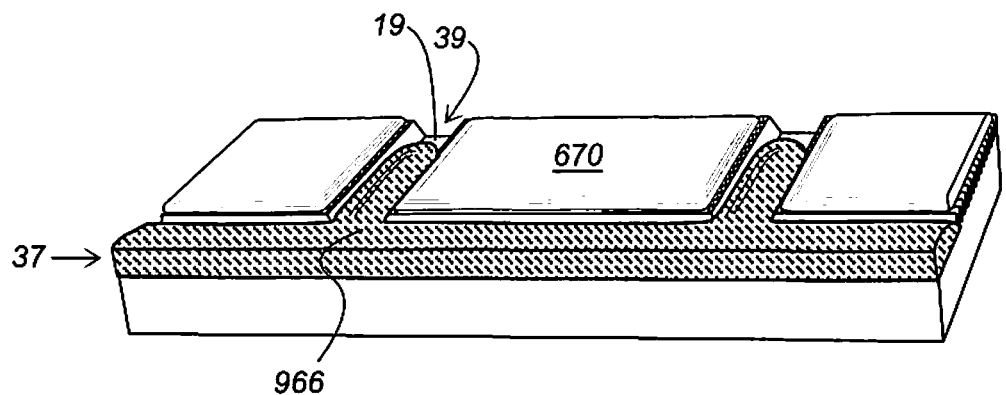
Figure 9D:
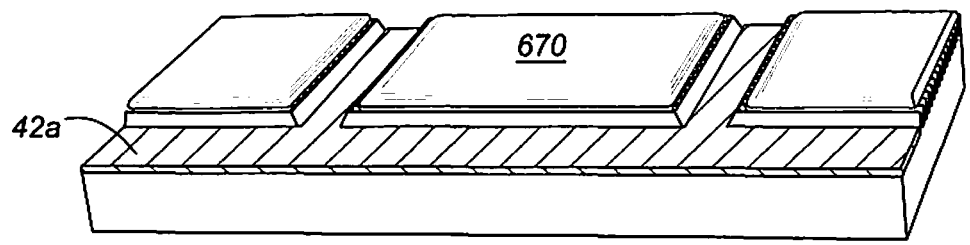
Figure 10:
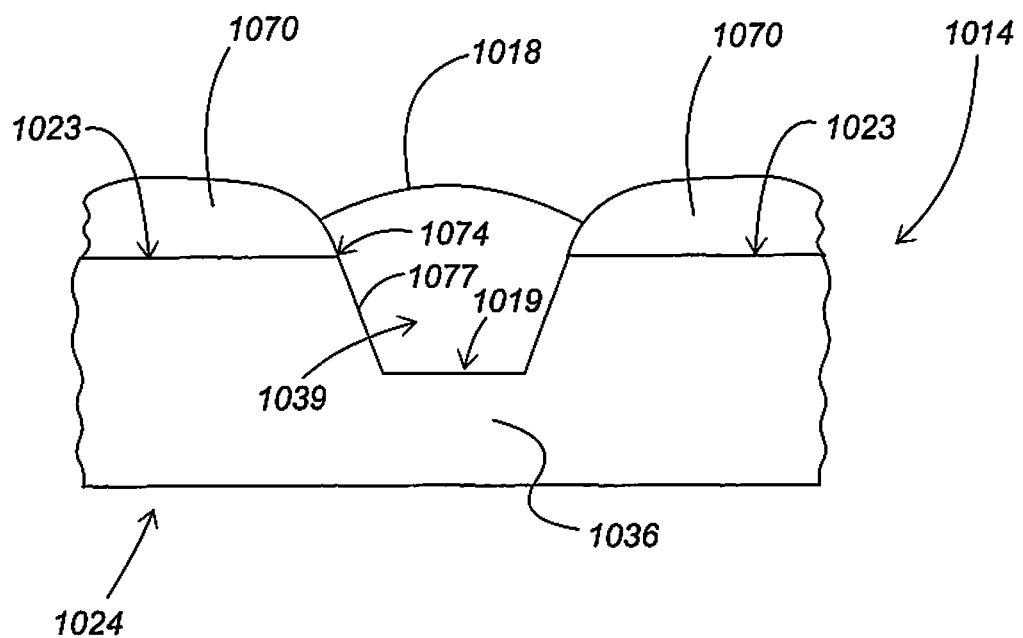
Figure 11A:
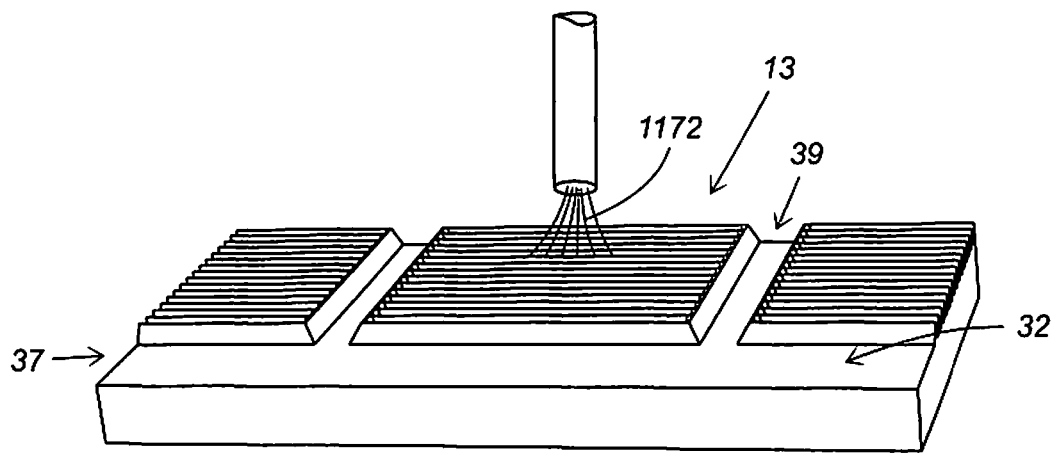
Figure 11B:
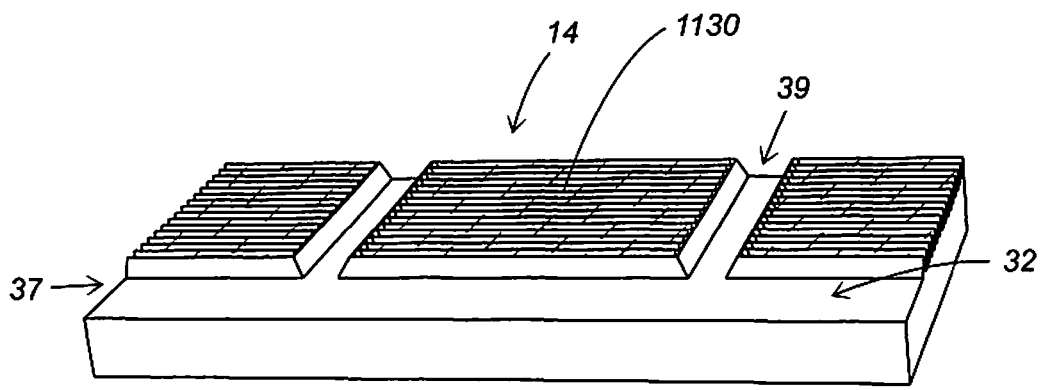
Figure 12:
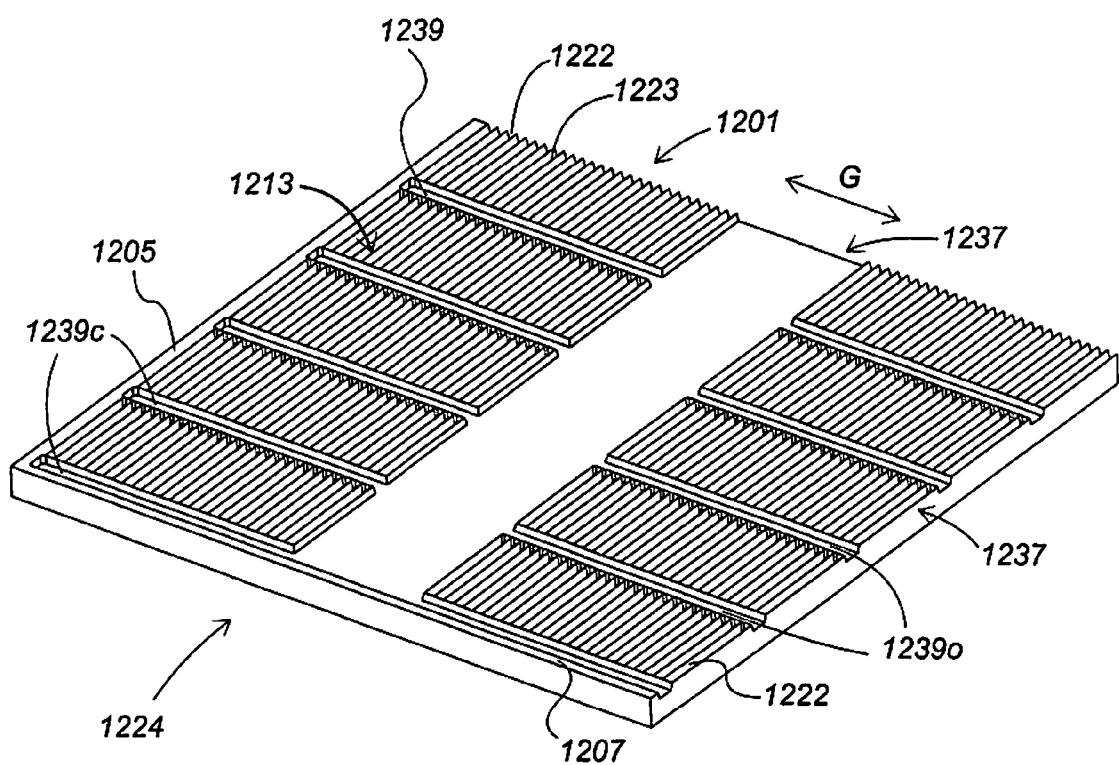

FIGS. 4A-4I are schematic representations in a near oblique view, showing steps of a treating method of an invention hereof, with: FIG. 4A showing an initial uncoated textured wafer; FIG. 4B showing a textured wafer entirely coated with an AR layer; FIG. 4C showing an AR etchant liquid applied directly to the bus bar metallization region and flowing into gridline electrode regions; FIG. 4D showing the textured wafer after the AR coating has been etched away; FIG. 4E showing a catalyst containing liquid applied directly to the bus bar region; FIG. 4F showing the textured wafer with an activated catalyzed surface; FIG. 4G showing the activated wafer with electroless plating solution applied directly to the bus bar metallization region; FIG. 4H showing a textured wafer with an electroless metal layer in the bus bar and gridline regions; and FIG. 4I showing the textured wafer with an additional electrode layer on top of the electroless layer;

FIG. 5 is a schematic representation showing a cross section of a portion of a textured wafer taken on a plane that runs down the middle of a light trapping groove and cuts perpendicularly through a gridline channel;

FIG. 5A is a schematic representation of a liquid drop spreading on a flat surface, illustrating a contact angle;

FIG. 5B is a schematic representation of a drop of the same liquid as shown in FIG. 5A, spreading on a flat surface of the same material as shown in FIG. 5A, that encounters a textural element of a surface an edge, illustrating a texture-influenced contact angle;

FIGS. 5C-5G are schematic representations showing a portion of the cross section plane of FIG. 5 showing four stable positions of a liquid at an edge or on a land;

FIGS. 6A-6D, are schematic representations in near oblique view, showing phases of method inventions hereof applying a material to an absorber region of a photovoltaic device of an invention hereof, with FIG. 6A showing self-aligning material inoculation; FIG. 6B showing the material beginning to flow: FIG. 6C showing the material continuing to flow; and FIG. 6D showing the material fully flowed to its position as a self-aligned material;

FIG. 7A shows an enlarged view of an absorber region, with sharp edges around the absorber region;

FIG. 7B shows an enlarged view of an absorber region, with landed edges around the absorber region;

FIG. 7C shows schematically a view of an absorber region, with openings along the ridges between some grooves to facilitate full coverage;

FIG. 7D is a schematic representation, similar to that shown in FIG. 1, of another means for assuring communication between adjacent light trapping grooves, showing grooves bounded by a ridge, with an open channel adjacent the ridge, communicating with the end of each groove;

FIG. 7E is a schematic representation in cross sectional view showing a groove bottom that is textured;

FIGS. 8A-8H are schematic representations in near oblique view, showing phases of a method of an invention hereof using blocking steps and steps that use a bath, with FIG. 8A showing a masked wafer in a bath of AR etch; FIG. 8B showing the same wafer with the AR coating removed from the metallization regions; FIG. 8C showing the same wafer in a bath containing a catalyst; FIG. 8D showing the same wafer in an electroless bath with catalyzed metallization regions; FIG. 8E showing the same wafer with electroless plated metallization regions; FIG. 8F showing the same wafer in an electroplate bath; FIG. 8G showing the same wafer with electroless and electroplated layers in the metallization regions; FIG. 8H showing the wafer of FIG. 8G, after heating to alloy the electroless layer, adhere the metal layers and remove the mask;

FIGS. 9A-9D are schematic representations showing steps of a method of an invention hereof using blocking steps and steps that directly treat the metallization regions, with FIG. 9A showing a wafer having a mask blocking the absorber region and a direct treatment of AR etching chemistry in the metallization regions; FIG. 9B showing the wafer with the mask and a direct treatment of catalyst-containing liquid in the metallization regions; FIG. 9C showing the wafer with the mask and a direct treatment of electroless plating chemistry liquid in the metallization regions; and FIG. 9D showing the wafer with the mask and electroless plated metallization in the metallization regions;

FIG. 10 is a schematic representation in cross-sectional view of a gridline of an invention hereof, in place as formed in a channel having an upper portion comprised in part by masks covering adjoining absorber regions;

FIG. 11A is a schematic representation in near oblique view showing a beginning phase of a method of an invention hereof applying an anti-reflective material to an absorber region of a photovoltaic device of an invention hereof, showing applying material to a central portion of a zone of an absorber region;

FIG. 11B is a schematic representation showing the absorber region having been covered with anti-reflective material by a treating mode of exploiting surface texture;

FIG. 12 is a schematic representation of an artificially small PV cell, to illustrate different arrangements for the edges and margins of cells;

DETAILED DISCUSSION

Figure 1A:
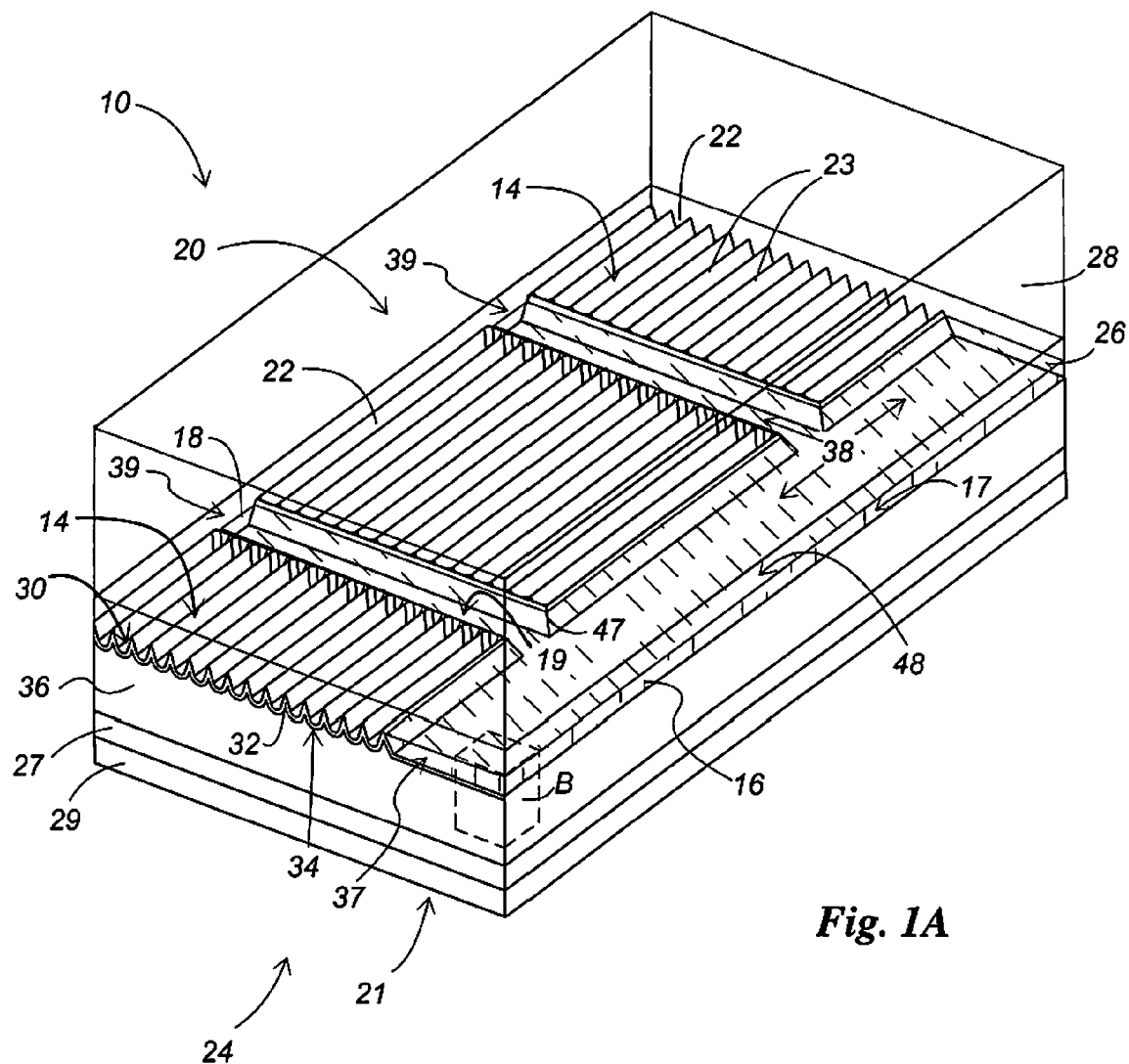
FIG. 1A is a schematic not-to-scale representation in near isometric view, of a portion of a finished photovoltaic device of an invention hereof cut along lines A-A in FIG. 1.

A finished, textured photovoltaic cell 10 is shown schematically in plan view in FIG. 1 and in FIG. 1A, an enlarged near isometric section view along the lines A-A of FIG. 1. A photovoltaic cell 10 is shown, with four light-trapping areas 12, separated by buswires 48. Each buswire lies over a busbar conductor 16. Each area 12 is made up of about fifty regions 14, which are bounded by a pair of busbars 16 and a pair of gridlines 18 (which may also be referred to as fingers herein). Each cell 10 may be on the order of about 156 mm square. (They need not be square, but that is a convenient shape.) Typically, such a cell would have three or four areas 12 of about 25-70 mm×156 mm (depending on whether two or three busbars 16 are present). The areas 12 include between about forty and several hundred regions 14, each of about 0.5-2 mm×about 30-70 mm.

As shown in FIG. 1A, at least one surface 20 of a silicon wafer 24 is textured in a pattern of grooves 22 that run parallel to the busbar 16. The walls of the grooves 22 refract light obliquely into the wafer body 36 and enhance the efficiency of light capture by forcing it to reflect internally several times within the silicon 36, so that the light is absorbed, rather than escaping back through the encapsulant 26 and glass 28. The grooves and their angled walls also reflect the light toward the glass 28 at angles that are more likely to result in the light being reflected back toward the absorbing silicon portion 36 of the cell 10, rather than escaping through the glass 28 to the environment outside the cell 10. The walls also give rise to reflections that are directly absorbed by the wafer 24 even before the light is reflected toward the glass for possible reflection back, or transmission out and loss. The grooves 22 have a depth of between about 3 µm and about 50 µm, and preferably between about 5 µm and about 50 µm. They also are about as wide as they are deep.

The sunward silicon surface 20 bears an anti-reflective coating layer 30 typically of silicon nitride (which is too thin to show with any thickness in the figures). Beneath this is a doping region 32 of $n^+$ phosphorous (also very thin, about four times the thickness of the AR coating), which creates a junction 34. Each of these layers 30, 32 and 34 conforms generally to the grooved surface shape of the surface 20. Beneath the junction 34 is the bulk 36 of the multi-crystalline silicon, which is doped p type.

Figure 1B:
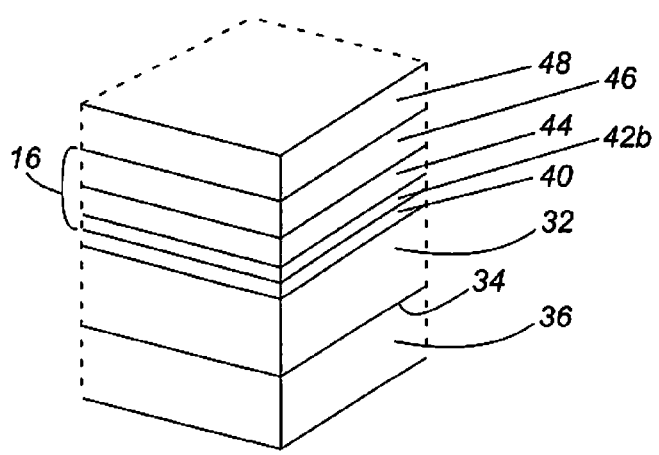
FIG. 1B is an enlarged view of the portion of FIG. 1A indicated at B, showing the layers of an electrode region.
Figure 1C:
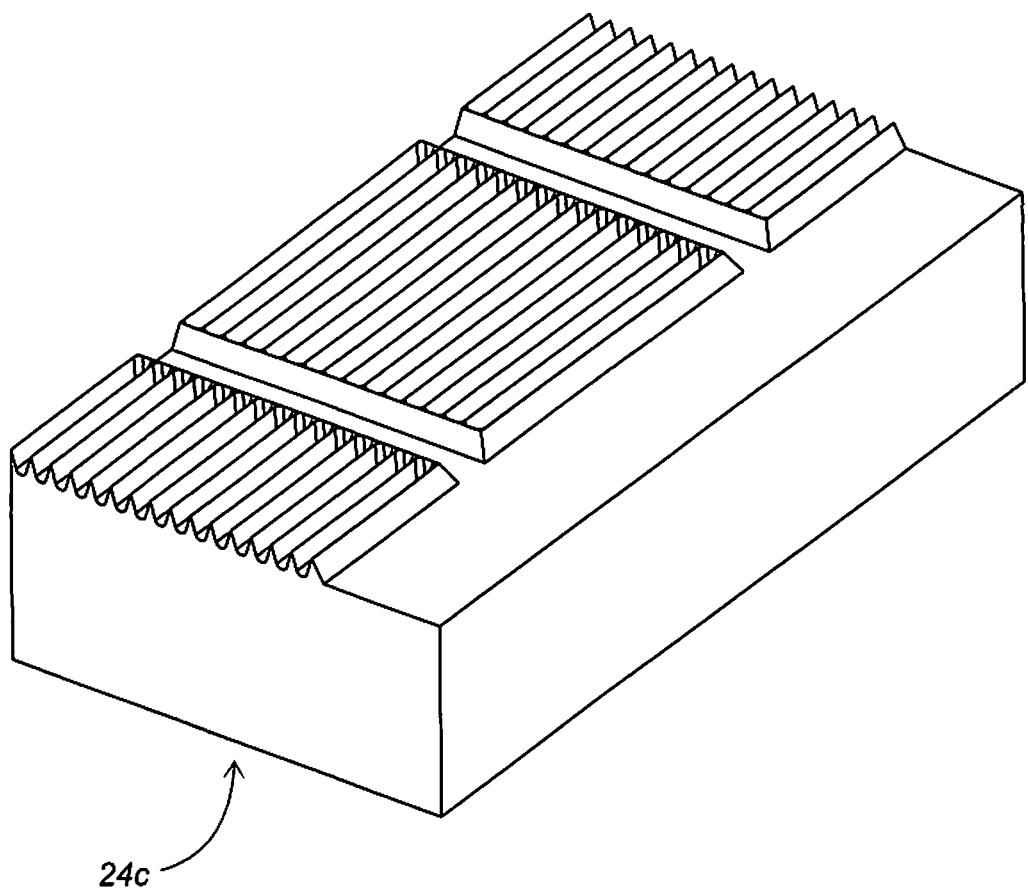
FIG. 1C is a schematic representation similar to that shown in FIG. 1A, that is not to scale, but is more closely to scale than is FIG. 1A, to suggest the relative sizes of portions of a photovoltaic device with a textured surface.

An interconnected network 38 of current carrying conductors 16, 18 traverses the wafer 24. Two general types of conductors are present. One type 18 is relatively narrow, and closely spaced from each other. These are called gridlines, or fingers. They carry electric current from the light trapping regions 14 to a larger conductor 16, known generally as a busbar. The busbar 16 lies in a busbar region 17 of the silicon. The gridline 18 lies in a gridline region 19 of the silicon. The metallization regions 17, 19, are themselves, typically layered as shown at FIG. 1B. A buswire 48 lays over a layered busbar conductor 16. The busbars 16 and gridline 18 layers are substantially identical (other than the buswire that overlays the busbar but not the gridline).

Taking the larger, busbar region 17 as representative, starting below with the silicon layer 36, p type silicon is adjacent a junction 34 between the p type silicon and doped n type silicon 32, doped with phosphorous. It is important to note that immediately adjacent and above (sun-ward) the doped silicon 32, there is no anti-reflective coating 30, such as is present at the light trapping regions 14 (but not shown with any thickness). Such an AR coating would impede good electrical and mechanical connection between the silicon 32 and metal conductors 16, 18. Thus, it is either removed from this region, according to steps and inventions discussed elsewhere in this disclosure, or, it might alternatively never be provided in these regions, also according to methods disclosed below. Thus, adjacent the doped silicon 32 there is a nickel silicide region 40. Adjacent this is a layer 42b of electrolessly plated nickel, which is relatively thin, as compared to other metal layers. Overlying the electroless Ni layer is a thicker electroplated layer 44 of copper (Cu) or silver (Ag). If copper is used, then a layer 46 of either silver (Ag) or tin (Sn) is present.

Buswire 48 may be rolled strip, or may be provided by any suitable means. For instance, the buswire may be of a textured surface, such as is described in U.S. patent application Ser. No. 11/588,183 in the name of Sachs et al, entitled, LIGHT CAPTURE WITH PATTERNED SOLAR CELL BUS WIRES, filed on Oct. 26, 2006, the complete disclosure of which is fully incorporated by reference.

Above the silicon wafer 24 is a volume 26 of polymer encapsulant, capped by a glass sheet 28, as is conventional. The back surface 21 may also include embodiments of inventions hereof, and may be fabricated according to embodiments of method inventions hereof. It need not, however. Those variations are discussed below. Adjacent the back surface is another layer of encapsulant 27, which is covered by a moisture barrier 29, which may be of a polyvinyl fluoride film, such as Tedlar® sold by Dupont de Nemours and Co.

Numerous photovoltaic advantages flow from the structure shown in FIGS. 1, 1A, and 1B, some of which arise due to the corrugated, grooved nature of the absorber 14, leading to better light trapping, and some of which arise because the conductors 16, 18 are located in trenches 37, 39, and some of which arise due to both of these features.

Providing a recessed channel 39 into which the gridlines 18 are placed serves a photovoltaic purpose, as well as a processing purpose. Because the interface between the gridline electrodes 18 and the silicon material 32 is a trench, rather than flat, there is more contact area per unit length, which enhances current flow between the silicon and the electrode. A gridline electrode 18 located within such a recessed channel 39 can be relatively tall and narrow, as compared to conventional, printed electrodes. Thus, the gridline conductor can achieve equivalent or greater cross-sectional area per unit width, as compared to a conventional flat gridline. Being narrower, each gridline shades less of absorber region 14, and therefore enhances efficiency collection of the cell.

Because the gridlines enabled by the masking process are finer than has heretofore been possible they also can be placed closer together. Thus, there is less resistive energy loss due to the sheet resistance of the emitter (because the charge carriers travel a shorter average distance before reaching a gridline electrode 18).

An additional efficiency arises due to the corrugated nature of the light-trapping absorber region 14. The corrugation gives the thin surface region through which the charge carriers travel more cross-sectional area of absorber through which to flow, and thus, there is less resistance and less loss per unit length of charge travel. The effect is similar to providing a wire for conduction having greater cross-sectional area. Because of lower resistance loss, the optimal emitter doping level is lower than it would otherwise be. This leads to higher current due to better response to short-wavelength light. In addition, the surface recombination losses are reduced.

Moreover the gridline 18 and busbar 16 electrodes of inventions hereof are plated metal, rather than printed metal containing ink, which plated metal has lower resistivity and lower contact resistance than the fired metal ink.

It will be understood that engineering compromises and balancing must be made among the width and height of gridlines, and their spacing. In other words, there may be a thinnest possible width to make a gridline, and a closest possible spacing, while the optimum combination of thinness and spacing uses neither the thinnest nor the closest values for these parameters.

In addition to the light trapping and photovoltaic advantages discussed above, inventions disclosed herein take advantage of liquid flow throughout textured regions of a workpiece that will ultimately become part of a photovoltaic assembly, for instance as driven by capillarity. It is convenient to informally refer to two different modes of exploiting surface texture and the flow of liquid relative thereto. One is referred to herein as a treating mode, primarily represented by the method illustrated with reference to flow chart FIG. 2A. The other is referred to herein as a blocking mode, primarily represented by the method illustrated with reference to flow chart FIG. 2B, particularly the steps that exploit a self-aligned mask and a bath, such as bath etching the AR coat 263. Examples of each of these modes are discussed below.

A treating mode is used with a liquid that is associated with an active, typically reactive treating step, which the user desires should take place at certain zones of the workpiece, such as plating or etching. The workpiece is textured such that the liquid can be deposited in a portion of a zone comprised of an interconnected network of liquid accessible pathways, and then migrates, for instance under the force of capillarity, to at least a portion of the remainder of the zone at which the user intends a chemical reaction to take place, but to no further zone. The network of pathways also incorporates one or more features, such as a barrier or an edge, which feature or features act as liquid flow impediments and prevent the liquid from flowing into zones that the designer intends the treating step to not take place. The process described below in connection with the schematic flowchart of FIG. 2A is an example of such a treating mode, a method of providing electrodes to the PV cell surface.

Turning next to a brief description of a blocking mode, self-aligning passive or blocking material, which will mask a zone, or in some way block an action from occurring, which is desired to take place in other zones, can be used. For example, typically, the collecting regions 14 are coated with an anti-reflective (AR) coating of silicon nitride 30. This coating is typically applied to the entire surface of the silicon. However, the AR coating prevents good bonding of electrode material to silicon. Thus, it must be removed from the metallization regions 17, 19 that will become plated. (In prior art, typically the AR coating is removed by reacting silver ink through it to form electrodes. That process has drawbacks.) According to methods of intentions hereof, the AR coating can be removed by chemical reaction such as etching in a bath. But, the light collecting regions 14 need to be protected so that the AR coating 30 remains there. This combination of needs can be accomplished by masking the collecting region 14. With the blocking mode, blocking material is placed in a portion of a zone comprised of a network of interconnected liquid pathways where it is desired to block a subsequent active step, and migrates to at least another portion of this zone where it is desired to block a subsequent active step. FIG. 2B shows a representative process in flow-chart form, and FIGS. 8A-8H, show some aspects of the device as it is processed.

An invention hereof involves a special geometric property of the arrangement of grooves in the design that facilitates using either or both of these modes of capillarity.

Figure 1E:
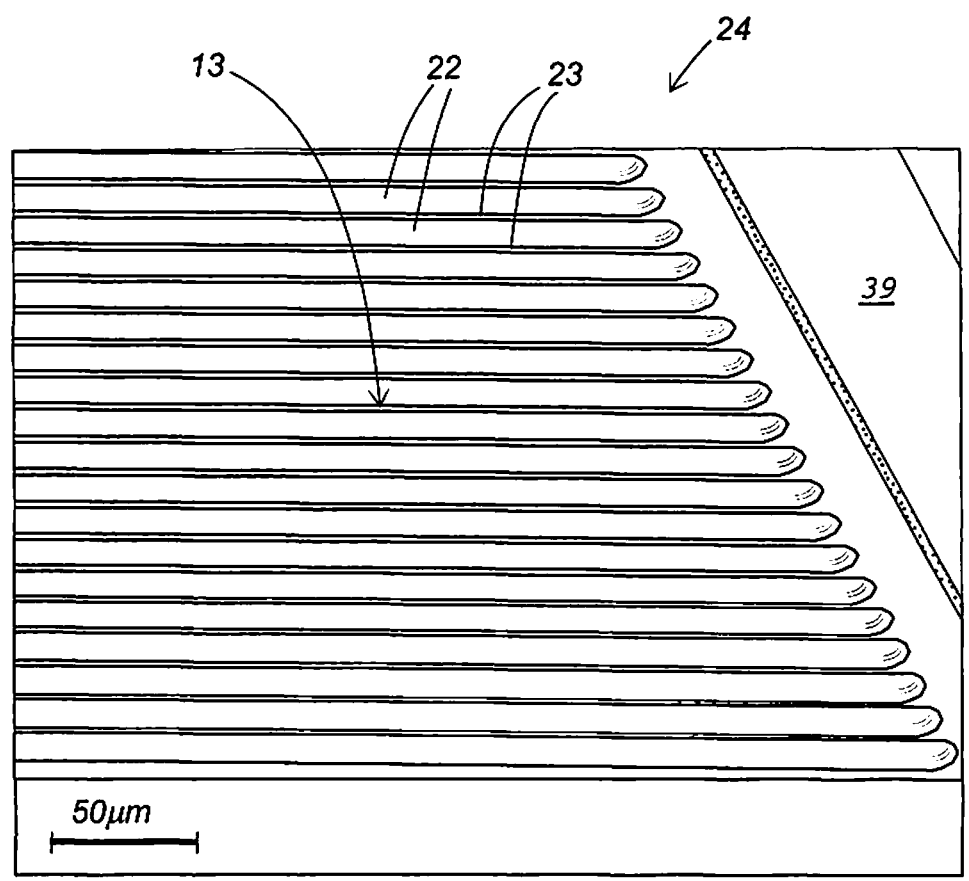
FIG. 1E is a schematic representation of a portion of a self-aligning texture etched into a silicon substrate in the region E shown in FIG. 1.
Figure 1F:
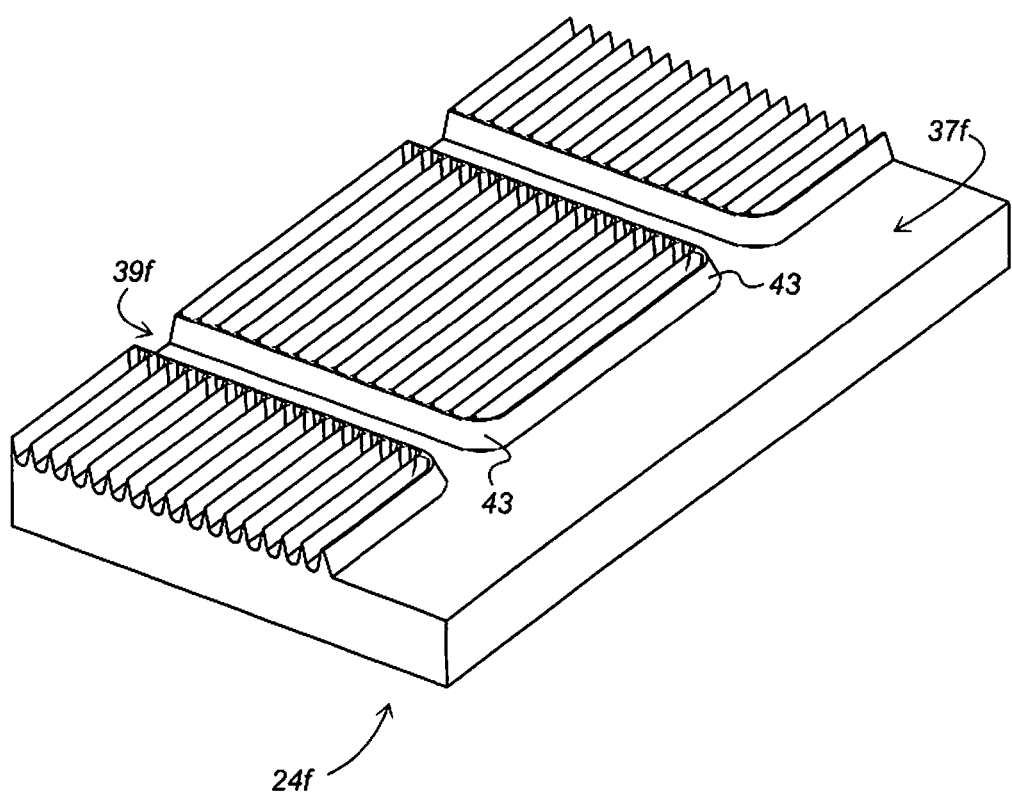
FIG. 1F is a schematic representation, similar to that shown in FIG. 1A, of an embodiment of an invention hereof with a continuously curved inlet from a busbar channel to gridline channels.
Figure 2A:
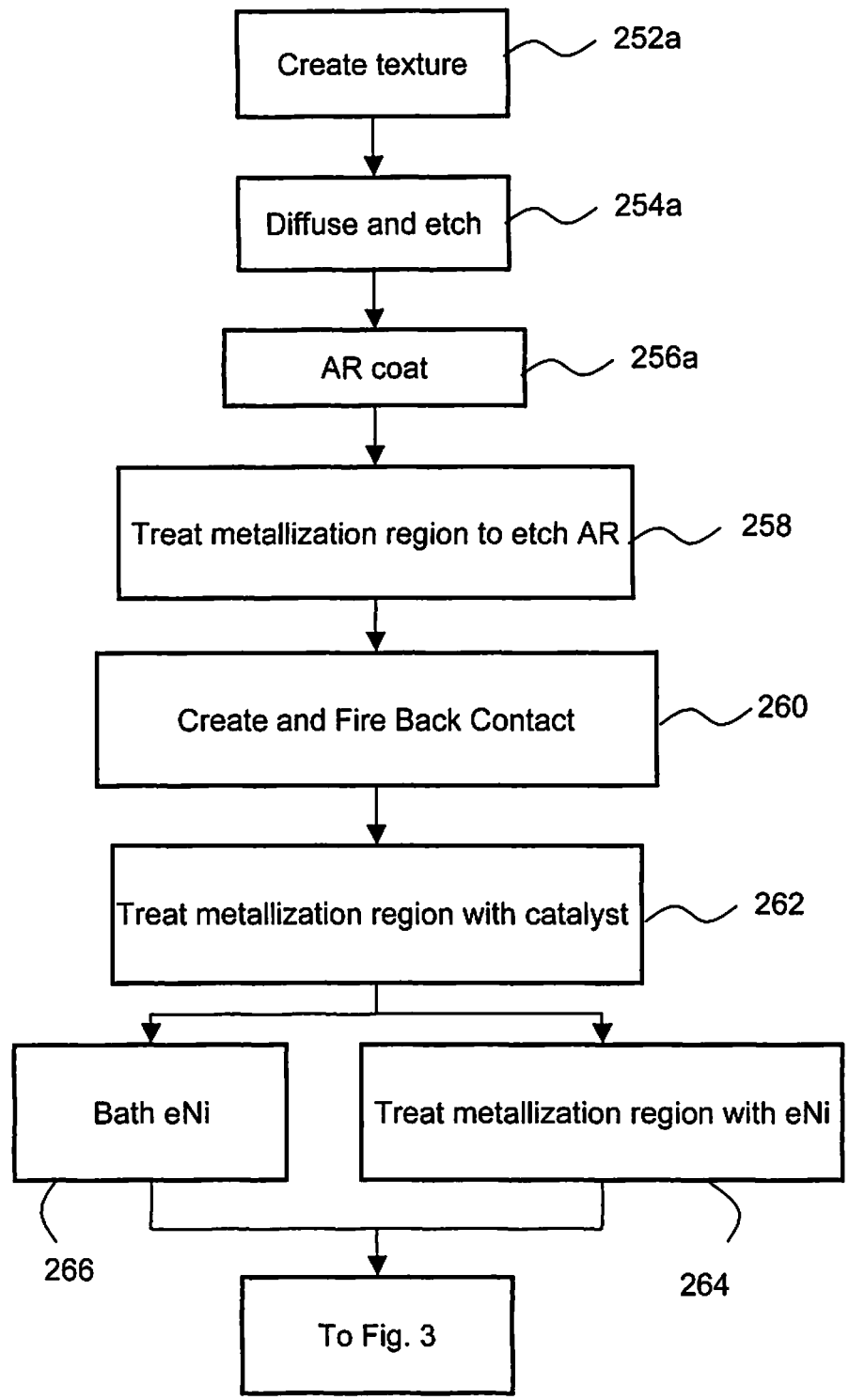
FIG. 2A is a schematic representation in flow chart form of steps of a method of an invention hereof that uses primarily treating steps that take advantage of topography of a work-piece.
Figure 2B:
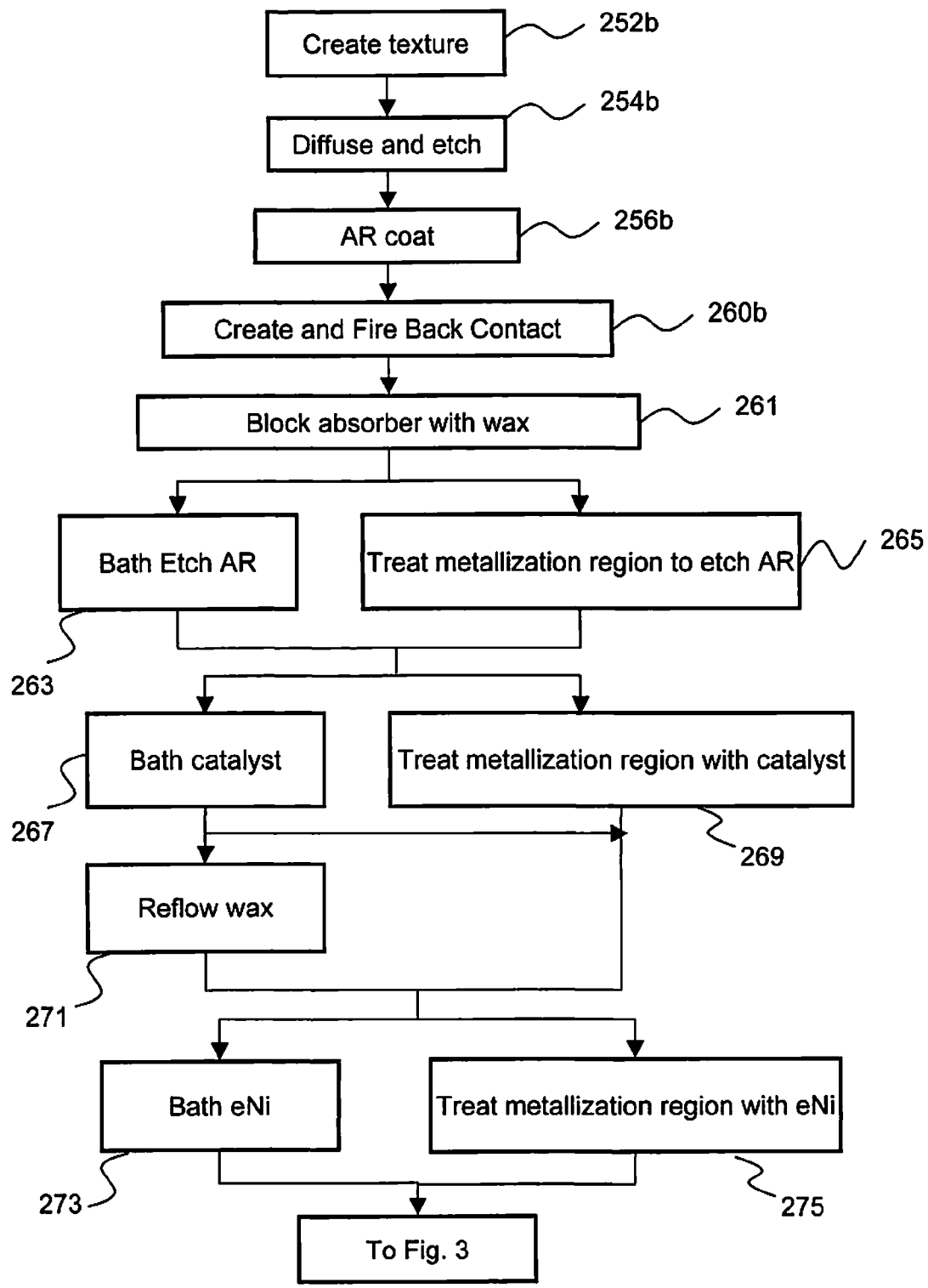
FIG. 2B is a schematic representation in flow chart form of steps of a method of an invention hereof that uses treating steps and blocking steps that each take advantage of topography of a workpiece.

A manufacturing sequence that implements a method embodiment of an invention hereof using a treating mode is shown in flow-chart form in FIG. 2A. Reference is also made to the structural elements shown in FIGS. 1A and 1B and to FIGS. 4A-4F, which show some aspect of the device as it is being processed. The texture is created 252a in the silicon wafer 24 by any appropriate method, such as is described below. FIG. 1E is a schematic representation of a portion of a silicon wafer 24 bearing a texture of grooves 22, separated by ridges 23. The region 13 that will become a light trapping region is shown bordered in part by a channel 39, that will locate a gridline 18. Phosphorous is diffused 254a into the wafer to create a p-n junction 34, typically by exposing the silicon to $POCl_3$ in a tube furnace. (Other dopant materials that can be used instead of $POCl_3$ include but are not limited to phosphoric acid and $P_2O_5$. The dopant is applied after texture is provided to the wafer. Some textures may impede the flow of liquids, or exclude liquids from certain portions of the surface. Thus, it may be beneficial to use dopants that are applied in a gas phase, rather than as a liquid.) The diffusion step 254a results in a layer of phosphorous all around the wafer 24. Any diffused material on the back surface 21 can be etched off (within this same step 254a) and the junction on the front surface 20, is thereby electrically isolated. In addition, any residual glass from the diffusion must be etched off the front of the wafer. These etching steps, while typically conducted separately from the diffusion, are all associated into step 254 for convenience in representation here. A thin layer of transparent dielectric material 30 is applied 256a as an anti-reflection (AR) coating (typically, 700 Angstroms of silicon nitride with extra hydrogen for passivation of the silicon).

FIG. 4A shows schematically, a portion of a patterned silicon wafer 24 bearing a network 38 of channels 37, 39 that will be metallized to form busbars 16 and gridlines 18 respectively. No coatings are present. FIG. 4B shows the silicon wafer 24 bearing an anti-reflective layer 30 on the entire upper surface 20, including the network 38 and the absorber regions 14 (although it is difficult to show the coating in the illustration).

The busbars are relatively wide, between about 0.5 mm and 5 mm and preferably 1.5 mm and 3 mm. The channels 37 into which they will be placed have a depth of the same depth as the grooves 22 between about 3 μm and about 50 μm preferably between about 5 μm and 20 μm. The gridlines are much narrower than the busbars, being between about 5 μm and about 100 μm wide, preferably between about 20 μm to 50 μm. The channels 39 in which the gridlines reside are approximately the same depth as the channel 37 for the busbars and the grooves 22. (The figures are not to scale.) It is relatively straightforward to deposit electroplating chemistry only within the regions 17 that will become busbars 16. For instance, this can be done by jet printing akin to inkjet, or valvejet printing, or programmable pipetting, all of which have more than the required resolution. Conversely, it would be very difficult to provide a liquid only directly within the small confines of the gridline channels 39, without contaminating the absorber regions 14. However, because the busbar channel 37 and the gridline channels 39 are interconnected, if sufficient liquid is placed within the busbar channels 37, capillary suction will draw the liquid into the hydraulically connected, smaller gridline channels 39.

The designer does not want plating chemistry to intrude into the regions 13 that will become light trapping regions 14. This can be prevented by regulating the amount of liquid deposited so that there is only enough to fill the desired areas. It is also useful and more robust to prevent errant intrusion of the liquid by means of the topography, shown in an enlarged view in 7A. For instance, the walls 477, 479 (777, 779 in FIG. 7) that border the metallization regions 17, 19, may be made sufficiently deep and steep, so that the liquid deposited therein does not overflow. It is also possible to provide an edge 474, 774 between the metallization regions and the absorber regions that further acts to prevent an overflow of the liquid into the light trapping regions 14, as discussed below.

As shown in FIG. 4C, an etchant liquid 458 is dispensed 258 (FIG. 2A) into network 38 of the metallization channels 37, 39 for the purpose of etching off the AR coating 30 in these regions 17, 19 and revealing the silicon 32 underneath. Dispensing 258 is typically into the busbar channels 37 of the metallization network with capillary flow into the gridline channels 39.

Typically, the etchant 458 could be a solution of hydroflouric acid in water. The AR coating 30 is so thin that the amount of etchant dispensed into the metallization regions 17, 19 is sufficient to consume all of the coating. Further, as the etchant does not attack the underlying silicon 32, the etching step can be allowed to proceed to completion with no critical timing required. The wafer 24 is then rinsed and dried. The views shown in FIGS. 4A, 4B, etc., are a partial section through a busbar channel 37, with walls like wall 474 on both sides. Thus, it will retain liquid. The result is shown in FIG. 4D, showing an AR coat 30 remaining on the light trapping regions 14, absent from the regions 17, 19.

The back contact structure (discussed below), shown in FIG. 1D at 237, 239 is created and fired 260 by conventional means, or by other means discussed below.

As shown in FIG. 4E, the metallization region network 38 is treated by dispensing 262 a liquid containing a catalyst, such as palladium 462 into it, leaving a catalyzed surface 463, shown in FIG. 4F. This catalyst will initiate an electroless nickel plating step. Note that a light oxide etch may be required on the front surface prior to treating step 262 in order to remove any oxide that may have formed during the firing step 260. The entire wafer can be so etched as there will be deminimis impact on the AR coating on the absorber. Electroless plating may be by either a narrowly directed treatment step 264 (FIG. 2A), or a bath step 266. (Embodiments of methods of inventions hereof that employ a bath are illustrated with reference to FIGS. 8A-8H, which are discussed below.) A directed treatment is accomplished, as shown in FIG. 4G, by applying the electroless nickel solution 464 selectively, 264, to the network of regions 38 that will become metal. A thin, electroless nickel layer 42a remains after this step, as shown in FIG. 4H. Alternatively, electroless nickel solution may be applied by immersing 266 the wafer 24 in a bath of electroless nickel plating solution. The electroless nickel will plate only where the catalyst 463 is present and thus only in the metallization region network 38. (FIG. 4I shows the state of a device after several other steps, which are discussed below.)

Figure 3:
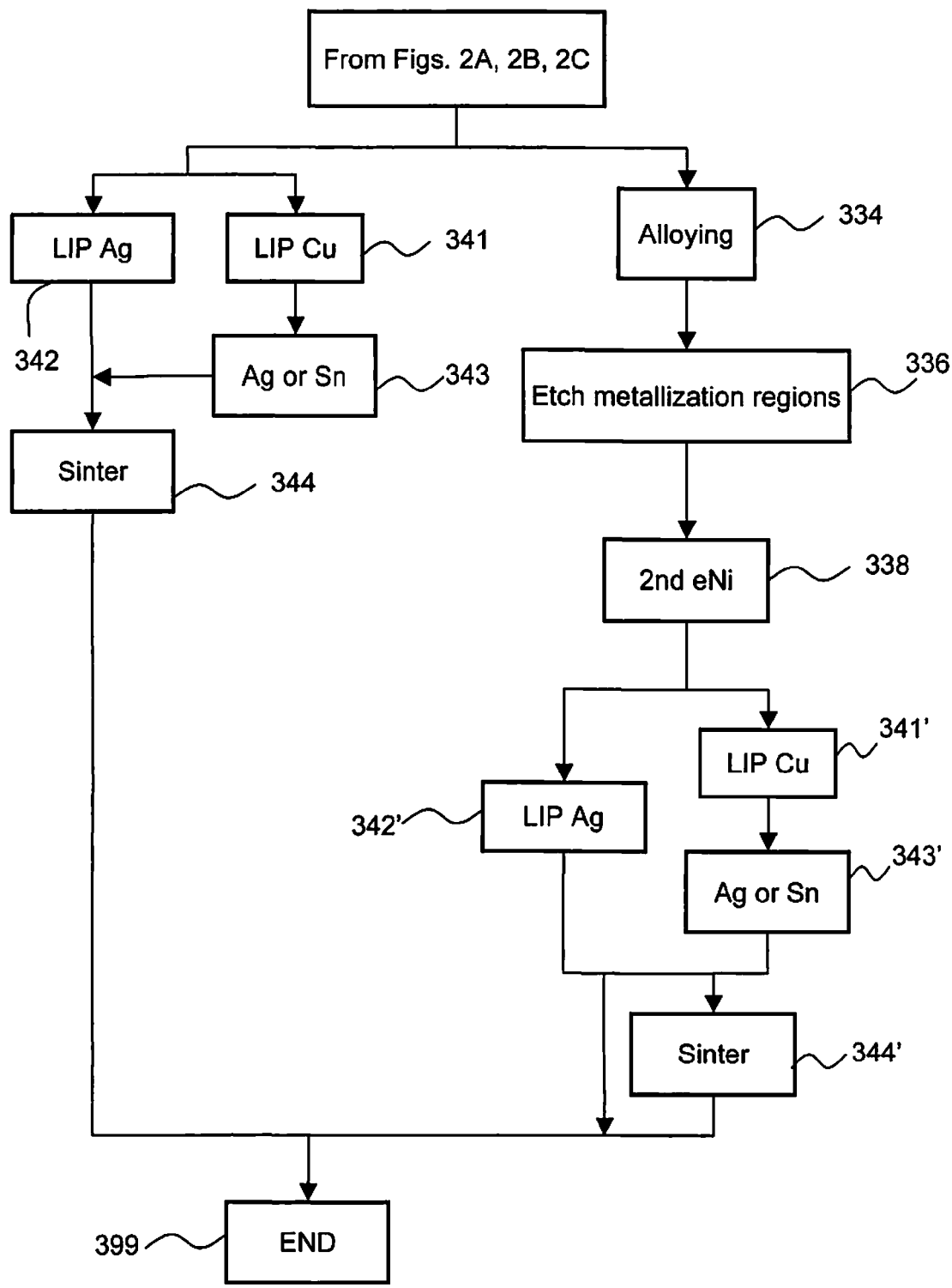
FIG. 3 is a schematic representation in flow chart form of steps of a method invention hereof, which steps are common to several different method inventions hereof, and which are performed after unique steps of variations, shown in FIGS. 2A, 2B and 2C.

FIG. 3 shows schematically, finishing steps that may be used with several different embodiments of method invention hereof. The finishing steps may be conducted in one of two basic sequences. Both sequences end with the two similar steps. A layer 44 of either copper or silver is electroplated 341 or 342 on top of the nickel 42a, for instance by using a process called Light Induced Plating (LIP). In LIP, a contact is made to the back electrode of the solar cell and the cell is immersed in a plating bath exposed to light. The photocurrent created by the cell acts as the current to drive electroplating. Often some bias voltage is applied to the cell as well. Following the deposition of the metal, the cell is sintered 344, which both alloys the nickel 42a with the silicon 36 to form nickel silicide layer 40 and promotes adhesion between the copper or silver and residual unreacted nickel 425 (FIG. 4I) from the nickel layer. The process ends 399.

In one alternate path, several additional steps precede plating 342 and sintering steps 344. In an alloying step 334, the nickel 42a is heated and alloyed with the silicon to create a nickel silicide layer 40 (FIG. 4I) for better adhesion to silicon and to create ohmic contact. Any excess, unalloyed, nickel is etched 336 off the cell. A second electroless nickel plating step 338 is performed providing a layer of electroless nickel. The state then appears as shown in FIG. 4H, but with a nickel silicide layer between the silicon 32 and the electroless nickel 42a, as shown, and on nickel silicide layer. The next step is LIP 342' of the conductive metal (silver or copper) 44 and a final sintering 344' to promote adhesion between the metal layers as explained above. The nickel layer deposited in step 338 aids in adhesion and also serves as a diffusion barrier if copper is used, preventing any copper in the layer 44 from diffusing into the silicon 32 and degrading its electronic performance. If Cu is deposited, 341' rather from silver (Ag) 342' then an additional layer of either silver or tin is plated 343 on top of the copper, before sintering 344. The final state is shown in FIG. 4I, with an LIP layer 44 of silver capping an electroless nickel layer 42r, which is adjacent a nickel silicide layer 40 atop the silicon 32.

These steps shown in FIG. 3 may be used as concluding steps for any of the processes discussed below, in addition to the process under present discussion.

There are quite a few related embodiments of methods hereof. A method that uses primarily treating steps has been discussed above. Another embodiment, which uses blocking steps, is described generally immediately following. After that, characteristics of the texture that are exploited to conduct the steps are discussed. Following texture characteristics, variations of the treating and blocking methods by which surface texture and fluid flow relative thereto is exploited, are described.

Turning now to a detailed discussion of a representative blocking mode process the method is illustrated with reference to FIG. 2B. The first three steps are similar or the same as those used in the method and variations illustrated with respect to FIG. 2A: create texture 252*b* just discussed, diffuse and etch 254*b*, and AR coat 256*b*. The back contact is created and fired 260*b*, as discussed above also.

FIGS. 2B and 6A-6D show an embodiment of a method invention hereof in which a self-aligning mask 670 is applied 261, to the light trapping region 14. The mask will block action of other steps from affecting the masked region 14, which, like the rest of the surface 20 of the wafer 24 bears an AR coating 30 which it is desired to retain. The fine grooves 22 act as capillaries in the light-trapping region 14 texture. As shown in FIG. 6A, they are inoculated with a volume 672 of a self-aligning blocking material, for example a wax. The wax is either provided in a liquid form, or a solid that is then processed as shown in FIG. 6B to convert to a liquid form. The liquid flows, for instance by capillarity, throughout the zone 14, as shown in FIG. 6C flowing along the narrow grooves 22 to all portions of the zone 14 until it reaches a barrier 674*a*, 674*b*. Several different liquid flow impediment types may be present. The wax stops flowing, hardens and becomes a mask, but no mask is provided beyond the barrier.

Some of the different types or portions of flow barriers or impediments shown at a larger scale in FIGS. 7A and 7B include walls 770 at the ends of grooves 22, simple edges 774 and landed edges 771, 773, which are separated by a land 775 which are discussed below. The mask 670 blocks the light regions 14 of the cell from having the AR layer 30 (FIG. 1A) removed, and from being covered with metal during subsequent steps.

A land 775 is more effective than a simple edge 774 at preventing the flow of a liquid. For this reason, the ridges separating grooves within a single zone, e.g. an active region of the cell, should be as sharp as possible so they least resemble a land separating the grooves. If these ridges become blunted, they can force the liquid back from the peak of the ridge, exposing it to the metallization process.

Generally, it is desirable for the surface area of the grooves to be at least approximately ¾ of the total area of the grooves and ridges. The blocking material may also be applied by techniques that have modest precision, including but not limited to, ink jet, valve jet and programmable pipetting, mentioned above. The blocking material could be placed by these methods near to the ultimate desired location, and then be allowed to migrate, for instance under the influence of capillarity, to the precise locations intended, where migration will cease due to barriers to fluid advance, as discussed herein. The material can be hardened, or otherwise stabilized in this position, such as by cooling, or heating, exposure to light, chemical reaction, etc., depending upon the type of material.

According to one possible process flow path, shown in FIG. 2B, the entire wafer 24 is etched 263 in a bath 858, shown schematically in FIG. 8A to remove the (AR) coating 30 from the regions to be metallized 17, 19 as shown in FIG. 8B. (Another flow path may be followed, which actively treats 265 the regions to be metallized while other regions remain blocked. This flow path is discussed below in connection with FIGS. 9A-9D.

There are numerous branch points within the process flows shown schematically in FIGS. 2A, 2B, 2C and 3. At any branch point, the process may proceed along either path. It is impractical to describe each possible combination of branch choices individually. It must be understood, however, that either choice is valid and can be taken.

It is also useful to apply 267 a palladium catalyst 862 selectively to the metallization regions 17, 19 where nickel is to be plated electrolessly. This catalyst application may be done by immersion 267 in a bath, as shown in FIG. 8C, or a general flow of a liquid over the region to be plated. The mask 670 blocks the catalyst 862 from being applied to light trapping regions 14 of the absorber, where it is not desired to plate nickel. It may be useful to reflow 271 the mask material, by melting and allowing it to reharden, which disables the catalytic activity of any catalyst that has adhered to the mask.

The next step is to provide 273 electroless nickel plating at the regions 17, 19, which will become the electrodes. This can be done by immersing the wafer in a plating bath 873 as shown in FIG. 8D. The wax mask 670 prevents the light absorbing regions 14 from becoming coated with metal at this plating step. Upon removal from the bath 873, the electrode regions 17, 19 are covered with an electroless nickel layer 42*a*.

As discussed above in connection with a treating method, the process flow path for concluding a primarily blocking method uses the steps shown schematically in block diagram form in FIG. 3, and in FIGS. 8F-8H. The finishing steps may be conducted in one of two basic sequences. Both sequences end with two similar steps by electroplating the wafer 24 in an LIP metal bath. They are similar in name and concept, but processing parameters and the initial workpiece may differ. A layer 44 (FIG. 8G) of either copper or silver is electroplated 342*b* on top of the nickel 42*a*, using an LIP bath process, resulting in the situation shown in FIG. 8G, where the mask 670 remains on the absorber region 14. The metallization regions 17, 19 now bear an electroless layer 42*a* and an LIP copper or silver layer 44. Following the deposition of the metal, the cell is sintered 344, which alloys the nickel 42*a* with the silicon 36 to form nickel silicide layer 40 (FIG. 8H) and to also leave a nickel layer 42*s*. Sintering also promotes adhesion between the upper metal layer 44 and residual nickel from the electroless nickel, most of which has reacted with silicon. The mask 670 is removed by any acceptable method, such as: burning it off, to provide the device as shown at FIG. 8H, with the metallized regions plated with a conductor 44 capping a nickel layer 42*r* and a nickel silicide layer 40 and the light trapping regions 14 coated with AR coating 30, and free of mask 670. The process ends 399.

In a useful implementation of the process, the self-aligned mask is removed automatically during whatever heat treatment naturally follows in the process sequence, for instance sintering 344. However, it may be necessary to remove the self-aligned mask by a separate operation, such as immersion in a solvent, or capillary action into an absorbent material, such as a sponge.

This separate processing step would become necessary if metallization were not selective enough to prevent portions of the masking material from becoming partly coated with electroless nickel. These metallic deposits can be lifted off by stripping off the mask with a solvent. But if they were to remain during heat treatment, they could adversely affect the performance of the finished cell. If this were the case, the self-aligning mask could be reapplied before light-induced plating 341 to present a favorable structure for forming gridlines with a high aspect ratio, as discussed below.

The path shown on the right hand side of FIG. 3 could alternatively be followed, which precedes the LIP 341', 342' and sintering 344' steps with alloying 334, etching 336 and a second electroless nickel plating step 338, as discussed above. The etching step 336 removes the first electroless nickel layer 42a. The second electroless plating step 338' again deposits an electroless layer. Following the alternate with the second electroless plating steps leads to an intermediary structure not shown, which includes an upper LIP metal layer 44, and an electroless nickel layer. This structure is similar to that shown in FIG. 8G, but the electroless layer has been provided through different steps. After sintering 344' the silicon reacts with the electroless nickel layer to form nickel silicide 40. The electroless nickel layer adheres to the upper metal layer 44 of silver or copper. The mask is removed as discussed. The structure is again as shown in FIG. 8H, with the metallized regions plated with a conductor 44 capping a nickel layer 42r and a nickel silicide layer 40. The light trapping region 14 bears an AR coating 30.

As is conventional, the busbars are soldered to inter-connect the current collecting fingers. Cells are soldered together in series and laminated into a panel.

An alternative exists to the pathway shown in FIG. 2B that includes the etch bath step 263 and the catalyst bath 267 and the electroless nickel bath step 273. Any one or more of these steps may be replaced by a direct treating step whereby the active agent is applied directly to the regions 17, 19 to be metallized. As shown in FIG. 9A, an etchant 963 may be treated directly at these locations. In such a case, the mask 670 may not be absolutely needed, but it provides useful insurance against errant etchant contacting the absorber region 14 during a direct treatment etching step 265. Similarly, the regions may be treated 269 with liquid 962 that contains a palladium (or other suitable) catalyst (FIG. 9B) without fear of contacting the absorber region 14. And finally, as shown at FIG. 9C, the electroless metal plating liquid 966 may be applied 275 directly, such as by jet printing, and flow by capillarity from the wider buswire electrode channels 37 to the narrower gridline electrode channels 39 without risk of contaminating the absorber region. The result is an electroless plated layer 42a as shown in FIG. 9D.

In general, the process designer can choose whether to use a bath step with a blocking mask, a direct treating step with a blocking mask, or a direct treating step without a mask for any of the steps of etching away AR coating from the metallization regions, catalyzing those regions for electroless plating, electroless plating in those regions or any other step that similarly employs exposing a region to an active agent that can be blocked by a mask. Thus, a bath step to catalyze such as shown in FIG. 8C could be followed by a bath electroless plating step, such as shown in FIG. 8D, or a direct treat electroless plating step, such as shown in FIG. 9C.

Similar to the step of reflowing 271 the wax mask 670, masking material can be applied to a first region, and then removed after a pertinent step is conducted that alters a second region. Then, a second mask, either of the same type, or a different type, can be applied to the first region, while other steps are conducted, from which the first region is to be protected. If the processing step does not alter the geometry significantly, then the same sort of mask material can be used again and again, and will reliably mask and expose the exact same regions.

Some masking materials are removed more easily than others. For instance, a first type of material may be provided and distributed, for instance by capillarity, within a first region, such as within the network 38 that will become the conductor channels 37, 39 and remain liquid, forming a sort of mask. A second type of material may be provided and distributed within a second region, such as within the network of grooves 22 that will become the light trapping region 14, and be excluded from the first region because of the liquid already residing there. Thus, the liquid first type of material in the first region forms a mask preventing the second material from entering the first region. The second type of material may then be allowed to become more fixed, such as by hardening, and the first liquid may be poured off or otherwise removed, thereby exposing the first region to the possibility of another step, from which the second region is now protected by a mask.

The foregoing has discussed exploiting surface texture and the flow of liquid relative thereto to treat the metallization regions, and also to apply blocking material to the metallization regions and/or the absorber region. It is also possible to exploit surface texture and fluid flow to treat the absorber region. An alternative method for forming the antireflection coating on absorber areas 14 of the cell uses inventive methods disclosed herein. A liquid, such as is known as a sol-gel precursor, may be applied to the grooved areas 13 of the cell in a metered amount and allowed to migrate from one portion of a zone 13 to fully cover the entire zone 13. It then can be caused to harden by a chemical reaction and heating.

FIGS. 6A-6D have been discussed above in connection with the discussion of distribution a masking material 672 to form a mask. FIGS. 11A and 11B show an early and late state of a device when texture is exploited to facilitate the flow of such a sol-gel material 1172, from an initial localized deposition (as a liquid) in the center of the zone 13, to spread to cover all of the zone 13, which will become the absorber 14 covered with an AR coating 1130. The intermediate stage would be similar to that shown in FIGS. 6B, 6C, but with sol-gel 1172 in place of blocking material 672.

So far, the processes and structures have been described in a dual sort of way, with two different textured regions of topography, a first, throughout which a treating or blocking liquid flows, driven, for instance by capillarity, and a second, from which a treating or blocking liquid is excluded, due to the texture and properties of liquid flow. In some cases, actions take place, and then a mask is removed. However, the processes can have any number of separate regions and serial steps of providing and excluding material and treating exposed regions while masked regions are blocked from treatment. Masks can be removed sequentially, with steps performed in between, preferentially, partially or all at once. For instance two different masks can be used, one that is removed by a first solvent, and another that resists the first solvent, but which is removed by another agent, such as heat, or a different solvent. A processing step can be conducted between the removal of the first and second masks. Fluid can be prevented from flowing into a region either by way of a mask, or because capillarity prevents such flow. Or, as discussed, treating steps may be conducted without using a mask at all.

The topography of inventions hereof serves at least dual, and possibly more purposes. For instance, the absorbing region 14 topography bears a plurality of parallel grooves 22. These serve a photovoltaic purpose, to redirect reflections of light to cause more of the incident light to undergo total internal reflection. The grooves 22 also serve a manufacturing purpose, to direct the flow of fluid, such as a masking material, to cover an entire absorber region 14, so that other zones external to that region may be etched of their AR coating 30, and/or provided with electroplating chemistry liquids. As a second example, the channels 37, 39 into which current carrying electrodes 16, 18 will be provided, are used for a photovoltaic purpose, by defining the location of the current carrying electrodes 16, 18. The channels also serve a manufacturing purpose, by acting as a fluid network through which the plating chemistry may flow, to enable plating throughout the metallization regions 17, 19, but not elsewhere, such as at the absorber region 13, which is effectively hydraulically isolated from the electrode network 38.

The following section discusses features, or characteristics of the topography, which facilitate a controlled flow of liquid, for instance by capillarity, to accomplish the various manufacturing purposes. A subsequent section discusses topography related to photovoltaic purposes.

Certain regions are defined, within which it is desired that a fluid flow, and beyond which it is desired that the fluid not flow. A boundary of some topographic feature bounds such a region. Taking the case of the absorber region 14 shown in FIG. 7A as one example, the boundary is the edge 774. Under appropriate pressure regimes, and considering the fluid viscosity and contact angle between the fluid and the surface material, the edge is suitable to prevent any fluid from flowing over it, even though some of the fluid may be gravitationally above the edge 774.

FIG. 5 is used to explain how an edge affects fluid flow and retention. FIG. 5 is a schematic representation showing a cross section of a portion of a textured wafer taken on a plane that runs down the middle of a light trapping groove and cuts perpendicularly through a gridline channel. Before exploring the specific case of a liquid in a groove bounded at least in part by an edge, it is useful to mention a simple case of a liquid on a flat surface having an edge. FIGS. 5A and 5B show contact between a wetting liquid 515 and a flat surface 520. The liquid surface forms an angle $\theta$ with the flat surface. For the wax tested on nitrided silicon, this angle $\theta$, was about 15°. FIG. 5B shows an example of the influence of a surface feature of an edge 574 on an apparent contact angle $\theta^*$ of a wax pool 572 as measured from the substrate surface 1120 of a substrate with an edge feature 1174. For the example shown, wax on nitrided silicon, the edge-influenced contact angle $\theta^*$, is about 50°, amplified from 15° by the surface feature of the edge 574. Theoretically, the enhancement due to an edge can be much greater, as illustrated below.

Figure 5C:
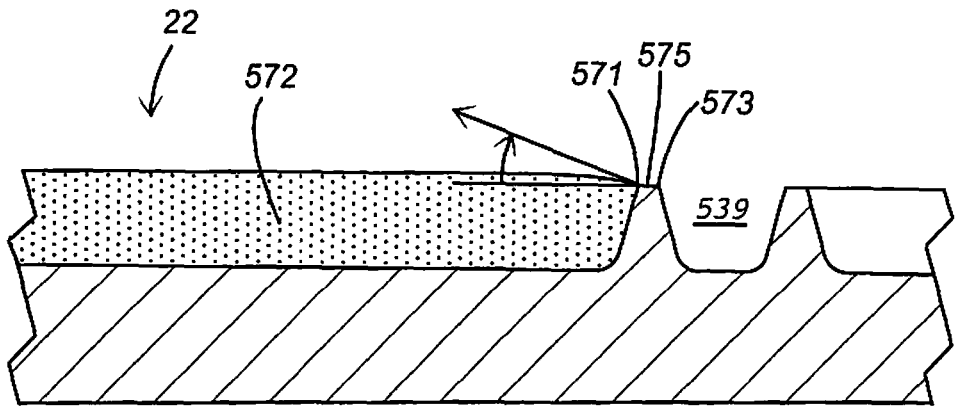

FIG. 5 shows a cross section of a portion of a textured wafer. The cross section is taken on a plane that runs down the middle of light trapping groove 22 and cuts perpendicularly through gridline channels 39. FIGS. 5C, 5D, 5E and 5F show a portion of the cross section plane of FIG. 5, but viewed normally to the cross section plane depicting four stable positions of the liquid 572. The liquid shown in FIGS. 5C-5F has a contact angle $\theta$ with the material of the textured wafer which is 30 degrees. In FIG. 5C, the liquid is pinned at edge 571 of the groove 22 and the contact angle $\theta$ between the liquid surface and a horizontal line through this edge is less than the wetting angle—less than 30 degrees.

Figure 5D:
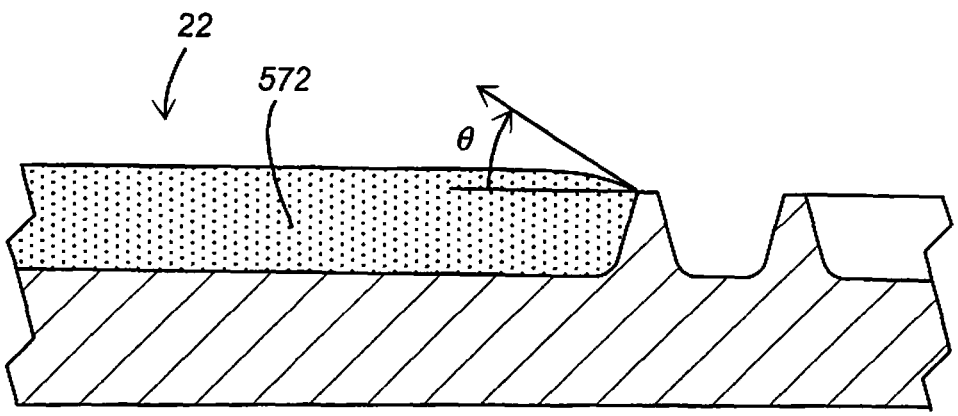

From FIG. 5C to FIG. 5D, more liquid has been added to the volume of liquid 572 and the angle of the liquid with respect to the horizontal at the retaining edge 571 is just at the wetting angle. This represents the highest level of liquid that can be retained stably at edge 571.

Figure 5E:
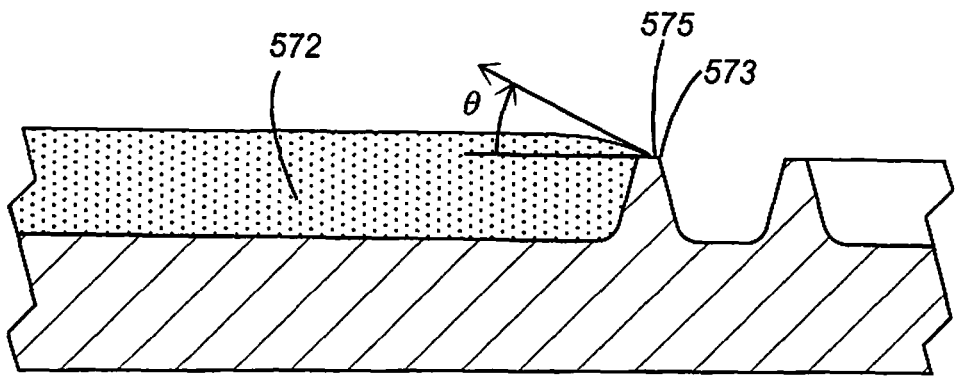

Between the time shown in FIG. 5D and FIG. 5E, more liquid has been added and the liquid has now advanced to a position on the land 575, making the appropriate contact angle $\theta$ of 30 degrees to the surface of the textured wafer.

Figure 5F:
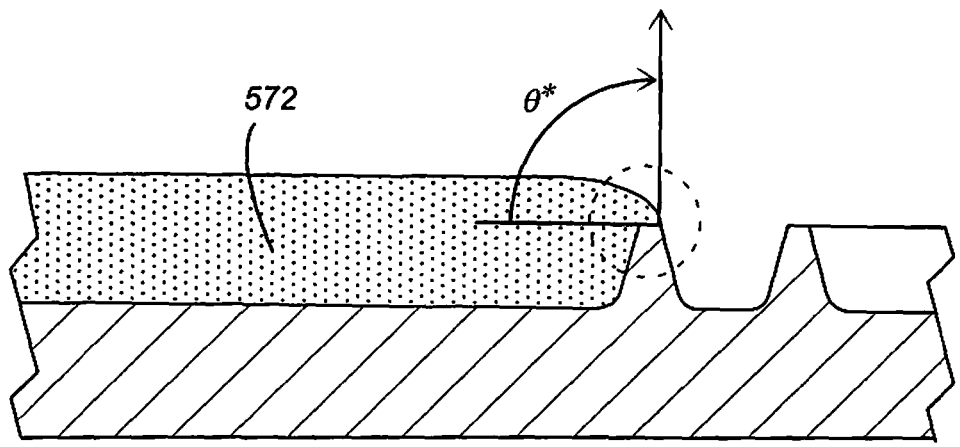
Figure 5G:
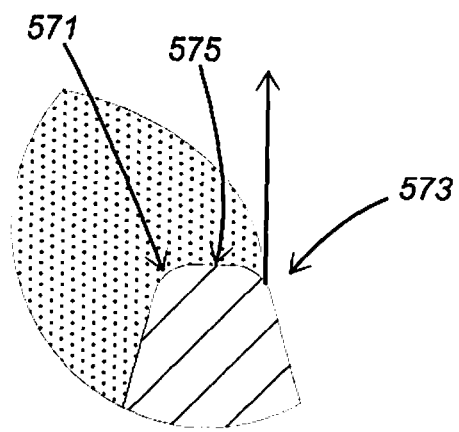

From FIG. 5E to FIG. 5F, more liquid has been added and the edge of the liquid is now pinned on the second edge 573 of the land 575. The liquid is shown with its surface essentially vertical at the point of contact to edge 573. In fact, the liquid could, in principle go even a bit past vertical in these figures, before spilling over the edge 573. This is best understood by reference to FIG. 5G, which shows an enlarged detail of the region of FIG. 5F which is circled. FIG. 5G also represents that the edge 571, 573 are not ideally sharp edges, but rather have a radius, which is exaggerated in the figure for purposes of illustration. The liquid 572 will more toward the position along a radius which allows it to satisfy the stable wetting angle condition, in this case 30 degrees to the surface, as shown.

It will be understood that FIGS. 5C-5F show cross sections and thus represent circumstances which are idealized to have no curvature in the direction perpendicular to the pane of the figures. The real situation, however, does have such curvature. However, the basic concepts described apply, as modified by the additional curvature.

Thus, it is seen that a flat land, as shown in FIG. 5 and also FIG. 7A at 775, bounded by edges affects liquid flow. In general fluid does not flow readily onto the land from the upstream side, due to the upstream edge 771, which causes the fluid to build up rather than advancing beyond the edge. (For the present discussion, upstream means from the absorber region 14. However, an edge can also prevent flow of liquid in the opposite direction, from a channel 39 into the light trapping region 14, under which circumstances the edge 773 would be considered upstream.) In some cases, if fluid does flow onto the land, and traverses it, the fluid will not flow beyond a downstream edge 773 of the land 775. In some circumstances a land is not entirely desirable, because of uncertainties as to whether fluid will flow onto it or not.

The designer may decide to use a relatively sharp edge 774, as shown in FIG. 7A, rather than a land. In general, an edge can stop the flow of liquid past it, as shown for the upstream edge of a land at FIG. 5D. However, in reality, an apparently sharp edge behaves like a land with a very narrow flat upper region.

A land can act as a double edge, providing redundancy in stopping activity, because there are two edges that affect an advancing fluid front by reason of capillary pressure. If the upstream edge 771 fails to stop the flow, the second, downstream edge 773 remains and may still stop the flow. On the other hand the uncertainty as to whether fluid has flowed to the land or not may suggest to the designer to opt for a relatively sharp edge.

Another feature that acts as a boundary beyond which fluid will not flow is a raised feature, such as a ridge or wall. For instance, at the end of each light trapping groove 22, a wall 770 and edge 774 (or a landed edge 775) exists. Fluid within the groove will not climb the wall unless sufficient volume and pressure and capillary attraction exist.

Another consideration of using surface topography or texture to distribute liquids, is to ensure that the entire zone desired to be filled, actually is filled. For instance, with reference to FIGS. 6A-6D, it is helpful to consider an absorber zone 14, which is a plurality of parallel grooves 622. One method to fill this zone is to provide a quantity of liquid in a drop, or blob 672, or as a solid that melts, within a relatively small central portion of the zone, such as shown at FIG. 6A, which quantity then flows throughout the zone as it melts, or as it is, for instance, sucked along by capillary action to all of the other portions of the zone that it is intended to contact. Sometimes, the fluid flow halts, for instance at an edge defined by a ridge 23 between grooves 22. Or, an individual groove or several grooves might be blocked with impurities or manufacturing defects. It may also happen that the charge of fluid 672 is slightly misplaced, and as a result, some portions of the desired target zone 14 might go unfilled. Thus, as shown schematically in FIG. 7C, it is beneficial to provide cross-channels 25c between grooves 22c so that fluid can flow throughout an entire zone 14c, once part of it is inoculated.

An example of this is shown at FIG. 7C. The grooves 22c, which make up the absorber region, are each intersected by an opening 25c in at least one, and more typically both of their bounding ridges 23c. Each gap 25c permits cross-flow in case the edge of a ridge becomes a barrier to flow in that direction, due to some anomaly, such as a pressure drop, or a mechanical impurity that affects the flow conditions. Typically, the gaps 25c are not facing each other, but rather are spaced apart along the length of the groove. Only a few gaps 25c are shown in FIG. 7C, to minimize drawing clutter. Some implementations might have most, if not all ridges 23c pierced by at least one and typically many openings 25c. Others could have fewer, such as piercing predominantly those ridges more distant from any dosing location.

FIG. 7D shows, schematically, another embodiment of cross-channels to ensure that the complete region is filled. Rather than piercing each ridge 23d within its interior with one or more cross-channels 25c, a single channel 25d traverses the entire marginal area, along at least one or, as shown, both ends of a row of grooves 22d, thereby permitting fluid communication from one groove to the next. Thus, all grooves may communicate with each other. Thus, impediments to flow along any single groove will not prevent the fluid from reaching the other grooves, and also, it may be possible for a blockage within a groove to be by-passed so that the groove may be filled from another end, which is not blocked by the blockage. This formation also provides additional protection against a liquid that is desired in one region, but not in another, from flowing into the undesired region. For instance, the cross channel 25c acts as an overflow reservoir to retain liquid errantly flowing from the absorber region 14d into a gridline channel 39, and vice versa.

The immediately foregoing has described features or characteristics of the topography that facilitate a controlled flow of liquid, to accomplish a manufacturing purpose. The immediately following paragraphs describe how the topography serves photovoltaic functions.

FIG. 7E shows in schematic cross-section a single groove 22e. The bottom surfaces 35 of the light trapping grooves 22e may in some circumstances be relatively flat. Such near flatness will result in reflections from the bottom 35 of the groove for reasons nearly identical to those governing reflections from a flat, un-textured surface. Thus, it is useful to provide a texture to the bottom of the grooves, which texture will cause yet more of the light that impinges upon the generally flat surface to reflect obliquely from the groove bottom, and strike a sidewall of the groove. Texturing the bottom of cells also would affect the angle by which light that passes into the solid body 36 of the silicon absorber travels through and strikes the back surface 21. Diverting the path from a straight one that intersects either or both front 20 and back 21 surfaces at a perpendicular angle enhances the possibility that the light will follow a path along which it is absorbed, rather than being reflected out of the cell.

The scale of texture elements 45 at the bottom 35 of the grooves 22e can beneficially have a characteristic length scale of between about 1 µm and about 5 µm and preferably between about 2 µm and about 3 µm. By characteristic length scale, it is meant a scale of a dimension that generally describes the formation, such as the depth d of very small grooves or their widths w. These features could be larger or smaller than the range specified above. Another useful measure is between about 1/10 and 1/5 the characteristic length scale of the grooves 22e (which are typically between 3 µm and 50 µm, and preferably between about 5 µm and about 20 µm).

The very fine texturing 45 at the bottom 35 of the grooves can be accomplished by any suitable means that can establish grooves or other texture of this small size. Possible methods include, but are not limited to ISO-etch chemistries known in the art for creating textures on multicrystalline silicon wafers. Some of these methods will also likely apply the very small scale texturing to the sidewalls of the grooves as well as the bottom.

The current industry-standard back contact on silicon solar cells is created by applying aluminum paste to the back of the cell and firing. The aluminum alloys with the silicon to make ohmic contact and to create a back surface field. However, the interface between the aluminum-doped silicon and the layer of sintered paste is not very reflective. Thus, the industry is moving toward a new back contact, which is made by depositing or growing an oxide layer and then depositing aluminum on top of the oxide. The combination of a thin (approximately 100 nm) oxide layer and an aluminum back creates a mirror with greater than 99% reflectivity. Another approach is to deposit a stack of oxide and nitride and then to deposit aluminum. In any case, openings must be provided or created through the dielectric layers so that the aluminum can contact the silicon. Typically this is done by laser ablation.

However, the back structure can be created according to an invention hereof, in much the same way as the front structure described above. A texture can be created on the back 21 and used to locally etch through the dielectric films using the self-aligned principle discussed above, where either blocking material, or treating material is directed to desired locations by the texture of the surface. For example, as shown in FIG. 1D, a texture can be created on the back 21 composed of an absorber region and a metallization region so that the light trapping grooves 22 on the front are orthogonal to those 222 on the back. Such orthogonal textures on the front and back provide for excellent internal light trapping as they each provide orthogonal components of reflection (front and back) and refraction (front only), leading to a high probability of total internal reflection at the front surface of the cell. Busbar regions 237 and 37d are parallel and aligned so that the buswire can make contact between the top of one cell and the bottom of the adjacent cell.

Figure 1D:
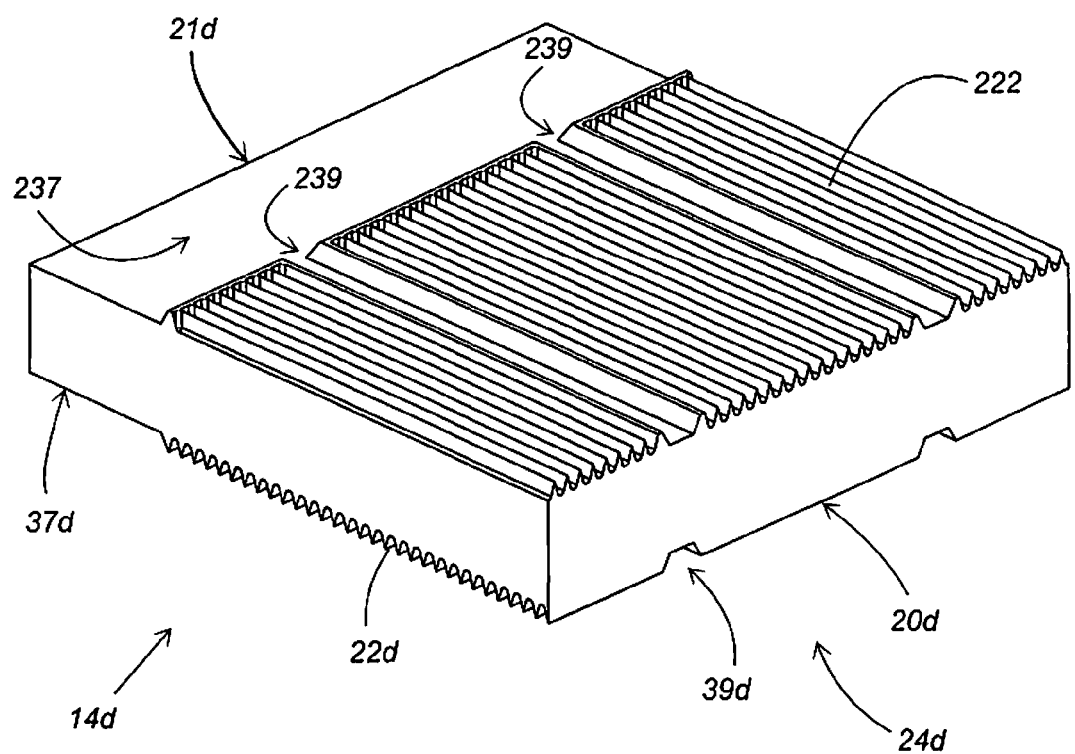
FIG. 1D is a schematic representation similar to that shown in FIG. 1A of a photovoltaic device of an invention hereof, similar to that shown in FIG. 1A, and also having a textured back surface, and which texture has been used in the manufacture of the device.

FIG. 1D shows the back side 21d of a wafer 24d, prominently. On the right hand edge, the profile of the grooves 22d of an absorber region 14d of the front side 20d can be seen, as cut through a section. Channels 37d for the bus bar and 39d for the gridlines respectively are also evident. While on the front, it is advantageous for texture 22d to be perpendicular to gridlines 39d, on the back, texture 222 may run parallel to gridlines 239 with no detrimental effect. This is due to the fact that the lateral conduction between gridlines 239 takes place in the full thickness of the wafer and not only in the new surface layer (as it does on the front). The back side texture would consist of a set of grooves 222 similar to those for light trapping on the front side and a set of channels 237, 239 for metallization (much the same as on the front 20d).

A candidate process sequence follows. The wafer is first patterned on both sides 20d, 21d, and etched to create topography on both sides. The wafer is diffused to create the junction on the front, and then etched to remove residual glass from the front and to remove the junction from the back. The wafer is then coated with silicon nitride 30 on the front and a stack of oxide and nitride on the back. Directed treatment of the metallization areas 17d, 19d, on the front with HF removes the nitride in the metallization regions. Treatment of the metallization regions on the back with HF will remove the oxide and nitride on the back 21d. Now, aluminum can be screen printed over the entire back and fired. The aluminum makes contact through the openings in the dielectric layers and it will be a reflective back everywhere else. Thus any light that does not reflect from the textured back surface 21*d*, but makes its to the back metallization will reflect back into the silicon. Metallization can then proceed on the front.

These are just a few examples of applying a topography to the back surface. However, for these, and any other shape of surface and reasons therefor, it is possible to provide a topography on the back surface that has a substantive, photovoltaic reason for being shaped as it is, and also, whose shape is used for a processing purpose, such as channeling liquid to flow in regions where desired, but only where desired, or blocking such flow.

Turning now to additional photovoltaic advantages facilitated by inventive processes hereof, the resistance of the gridlines 18 may be maintained at a low level by treating metallization chemistry into features with an aspect ratio approaching unity. FIG. 10 illustrates schematically how this is accomplished without substantial lateral spread of the plated conductor material. The grid lines 1018 can be made tall, because liquid plating chemistry can be provided (either by direct treatment, such as jet printing, or capillary flow, or a combination thereof) within deep, narrow channels 1039 formed at their bottom by the channel 1039 formed in the wafer 24 and at their tops between two regions of built up blocking material 1070 such as is used to mask the absorber region 1014. The upper portion of the sidewalls of the composite channels 1039 can be made relatively steep by selecting the contact angle between the material that forms the mask 1070, and the material and geometry of the wafer substrate 1036, so that the interface angle is relatively steep. The steepness of the walls can be enhanced even more by taking advantage of the texture of the surface and providing an edge, which enhances, enlarges the contact angle, as discussed above in connection with FIGS. 5-5F.

The foregoing has described inventions disclosed here in general outline. A representative article of an invention hereof has been described, as well as several process sequences for making such an article, and related articles. Two basic modes by which surface topography and texture and liquid flow with respect thereto is exploited, namely a treating mode and a blocking mode have also been described. It also has described many different texture features, how they are shaped and how they function. Below, additional process flow sequences are explored.

Figure 2C:
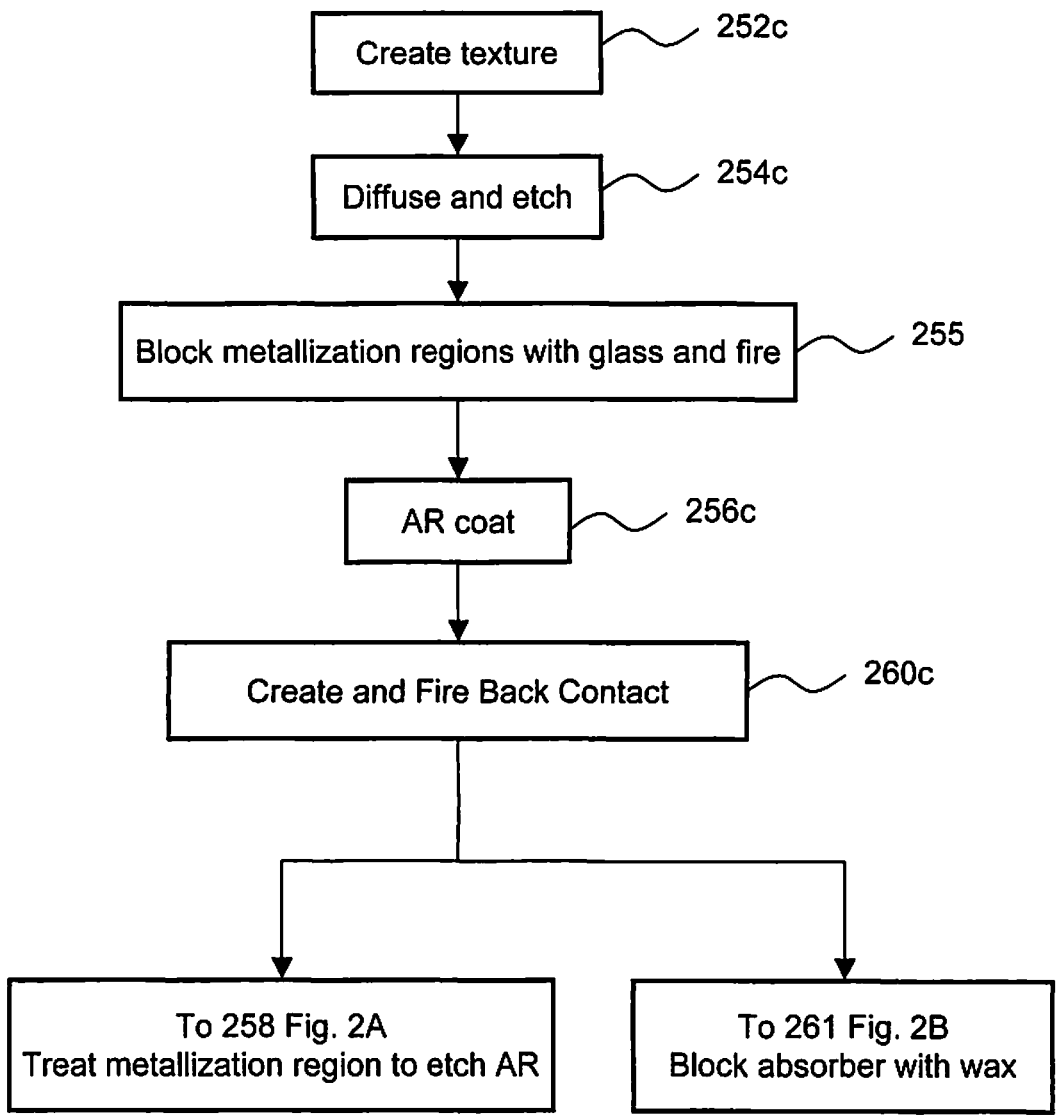
FIG. 2C is a schematic representation in flow chart form of steps of a method of an invention hereof similar to that shown in FIG. 2B, with additional steps that block an electrode region.

FIG. 2C shows, schematically, a flow of process steps that uses blocking in the metallization regions 17, 19, using an inorganic blocking material that is different from the blocking material mentioned above used in some processes to block the absorber region 14.

Steps 252*c* and 254*c* are the same as the first two steps shown in FIG. 2A. The next step differs. A liquid precursor is dispensed 255, which will form a silica glass upon firing (also included as part of step 255). This is in a class of materials called spin-on materials, widely used in microelectronics. An AR coating 30 is applied 256*c* next to the entire wafer 24 surface 20, including the light trapping regions 14 and the spin-on material-covered metallization regions 17, 19.

At this point, the designer has a choice. The process can flow to FIG. 2B, at the step of blocking 261 the absorber with wax. Alternatively, it can flow to FIG. 2A, the step of treating 258 the metallization region to etch the AR coating.

The AR coating in the metallization regions 17 and 19 is etched off by either a bath 263 if blocking 261 has been chosen, or more specific treatment 265 (FIG. 2B) or 258 (FIG. 2A). In either case, the blocking of metallization regions 17, 19 with glass accomplished above in step 255 is here exploited. The AR coating may be fired in such a way as to leave pinholes, which allow etchant to penetrate and etch the silica glass oxide blocking material, thus undercutting the AR coating and causing it to lift off with the silica glass. Thus, the AR coating can be removed rapidly. Otherwise, the fired AR coating is difficult to etch and therefore etches slowly. The etchant used does not affect the AR coating itself very quickly, so, even if the absorber is not blocked and is exposed to the etchant in a bath, or from errant etchant applied during a direct treating procedure, the AR coating on the absorber region will not be materially affected.

The remaining steps would follow the flow shown in FIG. 2A after the treating step 258 if no blocking step is taken, or the flow shown in FIG. 2B after blocking step 261.

Another blocking mechanism that can be used is a layer that prevents mechanical adhesion of the deposited AR coating and therefore leaves the coating as a fragile membrane which can be broken up and removed by ultrasonic agitation, for example.

The method of blocking the deposition of a film or films can be used broadly for any film and regardless of the purpose of the film.

The foregoing discussions have assumed that a wafer with the desired initial texture on one or both sides is provided, or formed, such as at step 252 of FIGS. 2A, 2B and 2C, without discussing how to form such a wafer. That step is discussed now.

A silicon wafer that has been doped in the bulk and cut to size, may be processed as follows. The wafer is cleaned and etched to remove surface damage from sawing. This step may not be necessary since surface damage is also removed in a step below.

The wafer is patterned with photolithography resist, which will prevent the direct attack of silicon by an etching solution. The photolithography resist is used to define a pattern that, during etching, evolves into the topography for light trapping and electrical contacts. Regions that are masked by the etch-resist are not etched away. Regions that are not masked, are etched away.

One embodiment of the patterning process forms a layer of etch-resist material on the upper surface of an initially flat silicon wafer. The process uses an etchant to etch away silicon from specific regions of an initially flat surface. The etch-resist prevents the direct, initial attack of silicon in the areas where it is placed. But etching can, in fact, take place in the vicinity of the etch-resist under the etch-resist layer. However, it proceeds more slowly under the etch-resist. For instance if a set of parallel lines of etch-resist are laid down with relatively narrow parallel exposed regions between, when etchant carves away material from exposed areas, the silicon surface is etched away leaving grooves carved in the silicon under the locations where there was initially no etch-resist. The etchant also under-cuts the silicon away from under the layer of etch-resist on the top surface to either side of the openings, etching its way through the surfaces of the silicon that are newly exposed due to etching a trench into the surface. When the etching action has progressed far enough, the still remaining film of etch-resist overhangs the etched grooves. At the precise moment when the etch-resist pattern becomes fully undercut, the topography of the silicon possesses sharp peaks between the etched grooves, and the etch resist detaches from the substrate. Typical depths for all of these features, as discussed above, are between about 3 μm and about 50 μm, and preferably between about 5 μm and about 20 μm.

The grooves carved in the silicon create both the light-trapping texture grooves 22 and a network of channels 39, 37 for the electrodes 18 and 16. The wafer is cleaned to remove residual photo=resist etch mask The self-aligning mask discussed above may also be used as an etch mask to facilitate deepening of the contact channels 37, 39, without altering the light trapping regions 14, if necessary. For instance, after initial patterning of the absorber grooves 22 and metallization channels 37, 39 have been formed into the surface such as at 252b, the absorber 13 can be blocked. The entire wafer can be exposed to an etchant that etches away silicon. The metallization channels 37, 39 remain exposed, and thus, they will be etched away to be deeper than immediately after the first etching. The absorber region 13 is protected from this second etching. The mask blocking the absorber region 13 could then be removed and the process would pick up at 254a of FIG. 2A, or 254b of FIG. 2B, to diffuse and etch the entire wafer. Thus a mask may be used to deepen the metallization channels even in a process that will not use a mask for subsequent processing, such as is shown in FIG. 2A.

The foregoing has described, generally, grooves as making up the light trapping region 14. The metallization regions 17, 19 may be provided with recessed channels. These terms have been applied relatively consistently to their different uses, but these terms are both meant to describe generally the same sort of topographic feature, namely a continuous concave surface. Concave is used in this specification and the claims attached hereto to mean a surface with a negative mean curvature. Convex is used herein to mean a surface with a positive mean curvature.

Generally, a texture design that provides an interconnected network suitable for directing fluid flow from one portion of a zone to the remainder of the zone, including other portions of the zone, is a network of concave surfaces, wherein any concave surface occupying one zone is joined by at least one concave surface to the network comprising the remainder of the zone. Typically, a photovoltaic cell 24 is divided into a set of textured zones 14. A zone 14 is distinct and can be separated from other zones by a convex surface or fluid flow impediments that traces a closed loop such as at L, FIG. 1, surrounding the zone 14. This closed loop constitutes the boundary of the zone. The texture within a zone 14 may comprise a set or network of concave grooves 22 interspersed with convex ridges 25.

As has been explained, the grooves within a zone 14 are oriented so that they direct liquid to migrate from a first portion of the zone to other portions of the zone without migrating outside the boundary of the zone.

According to an embodiment of an invention hereof that exploits the surface topography and liquid flow relative thereto primarily driven by capillarity, the principal driving force for distributing liquids during treatment or blocking steps is the relative magnitudes of the surface energy of liquid components and localized areas on the solid substrate. The effect of grooves, or corrugations or roughening of a solid surface amplifies differences in surface energy between the liquid and solid phases. A liquid that is attracted to a solid surface will become more strongly attracted when the surface is roughened or corrugated. Silicon and the AR coatings used on photovoltaic cells are somewhat hydrophobic (water-repelling) and so roughened or corrugated surfaces tend to repel aqueous liquids (i.e. liquids that are water-based, or contain substantial amounts of water) more strongly when they possess surface texture.

For instance it is beneficial to provide small grooves within the gridline channels 39 that are parallel to the channels 39. These smaller grooves will enhance flow along them. Deliberate roughness in the channels may also be employed.

Many aspects of inventions hereof are possible because surface attraction and repulsion of liquid substances may be further refined by careful design of the geometry of the surface texture. A groove inscribed in a solid surface acts like a channel for conduction of liquid along the groove, while sharp edges that bound the groove strongly restrict the passage of liquid. Thus, liquid can be distributed rapidly in chosen directions (e.g. along a groove), but not at all in other directions (e.g. across an edge).

A chemical means for modifying surface energy has been shown to be able to enhance the effects of surface texture. For instance, ozone generated by an ultraviolet light source is able to modify hydrophobic silicon and silicon nitride to render it temporarily more attractive to aqueous liquids than it would be without the ozone. This process is particularly effective at enabling localized dosing, such as treatment by aqueous hydrofluoric acid to remove insulating coatings from metallization regions; treatment with aqueous catalyst to nucleate electroless plating in these same metallization regions; and treatment with aqueous electroless plating reagent to deposit metal contacts. In other words, the ozone treatment enables these fluids to flow more freely, and thus, helps distribute them within the small gridline channels.

Other chemical treatments may be applied to enhance surface attraction of a textured surface. Surfactants may be added to liquid reagents to enhance the surface attraction with the substrate.

Another method for altering the surface attraction of silicon and silicon nitride is to form a film of silicon dioxide over the substrate surface, e.g. by oxidizing at elevated temperature or by anodic oxidation. Silicon dioxide is substantially hydrophilic, so an oxidized silicon or silicon nitride surface may be subjected to aqueous chemical treatments with localized dosing followed by capillary migration along selected topographic features on the substrate.

Figure 1G:
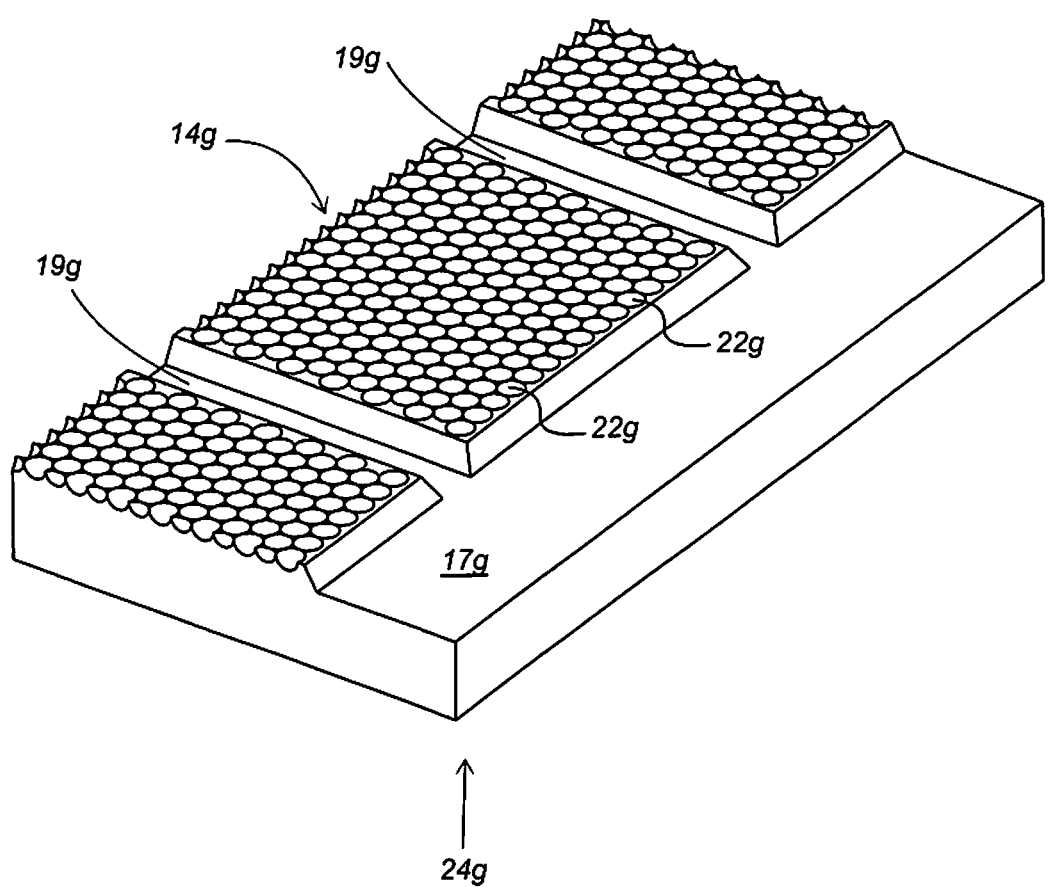
FIG. 1G is a schematic representation, similar to that shown in FIG. 1A, of an embodiment of an invention hereof with a textured surface of an array of local depressions, rather than an array of extended grooves.

The foregoing has depicted the grooves 22 in the light trapping region 14 to be substantially straight and generally uniform in width and depth. If grooves are used, they need not be straight or uniform in either width or depth. They can be curved, angled, relative to each other, such as in a chevron pattern and sloped. They can be radiating lines from a central location joined by concentric grooves. What is required is that the pattern of grooves must be such that a charge of material that is desired to reach an entire zone, can be deposited at a portion of a zone, and then migrate to all other portions of the zone where it is desired to be reached. There may be one or many locations at which the material is deposited within a zone, which number will be determined by balancing the accuracy of the delivery method (e.g. ink jet printing, as compared to hand placing solid filaments of wax), time constraints of the process, etc. The texture in the absorber region may also be other than grooves. This texture could be nothing but the type of texture typically created with iso-texturing methods described earlier. FIG. 1G shows light trapping features on a hexagonal array. Such approaches might be particularly well suited to cases where all processing is accomplished by treating in the metallization region. In such a case, texture in the absorber region only plays a role in light trapping and not in subsequent fabrication steps. Indeed, in this case texture may be absent from the absorber region.

It will be understood that an essential aspect of some inventions hereof is the use of a texture to localize the action of subsequent fabrication steps. Further, this localization is most critical in separating the various functional regions of the intended device, for example, in separating the absorber region and the metallization region as described. However, it will be understood that this means of separation might be used between other functional regions of the device. For example, there may be two or more different types of metallization material used in different regions of the cell. The edges of the cell or wafer are also important boundaries. Thus, as shown with reference to FIG. 12, the texture may be designed to aid in defining subsequent processing steps so as to extend immediately up to the edges 1201, 1203 of the cell 1224, or to deliberately leave a border region 1205, 1207 around the perimeter of the cell, which border region may either be an active part of the cell or not, as desired. It should be noted that FIG. 12 is meant to show edges 1201 and 1203, 1205, 1207 as they actually are, not as a cut for purposes of illustration. (However, to show all four edges in one figure, they are each shown as unrealistically short. In reality, the scope of an entire wafer would be as shown in FIG. 1, with many regions 1213. Gridline channels 12390 are actually open at one end, while gridlines 1239c are closed at their outer ends. Further, light trapping grooves 1222 at edge 1237 are open ended, whereas at edge 1207, they are closed ended.

The foregoing discussion has described the semiconductor as being an n-type on p-type. This is the most commonly used form today, due to the lower relative cost, as compared to p-type on n-type. However, inventions disclosed herein can also be used for p-type on n-type silicon. Some steps would need to be altered to accommodate the switch. However, the alterations would be of the type understood by a person of ordinary skill in the art. For instance, suitable dopants would be $B_2O_3$, and $BCl_3$, rather than the phosphorous dopants mentioned above in connection with the n-type semiconductor. Further, it would not be necessary to use LIP to electroplate the electrodes. Conventional electroplating can be used.

The junction need not be a continuous junction over the entire device, but rather may be localized, for example to stripes of diffused material. Further, the junction can be a heterojunction of two different semiconductor materials and is not restricted to being a homojunction. Further, the junction itself may be formed as a consequence of the metallization step. For example, if the metallization material has an n-type dopant within it the diffusion during metallization firing can create a self-aligned homojunction, thereby eliminating the need for a separate junction formation step.

The discussion above focuses on fabricating a semiconductor wafer, and silicon is used as an example. The silicon may be either multicrystalline or monocrystalline. Then, in addition, inventions disclosed herein can be used with semiconductors other than silicon. For instance, germanium or gallium arsenide semiconductor wafers could be made with a textured surface and used in a similar manner as is discussed above in connection with silicon semiconductors.

Further, the discussion above focuses on fabricating a semiconductor and a wafer is used as an example. However, inventions disclosed herein can be applied to structures other than wafers. For instance, they can be applied to semiconductor thin films applied to the sun-ward surface of a substrate that is not a semiconductor, such as a glass substrate. In that case, the surface texture, or topography is provided on the substrate (glass) and the semi-conductor thin film is applied on the textured surface of the substrate. For instance a film of cadmium telluride having a thickness of only one or two microns may be applied to a glass substrate, bearing surface textures as discussed above.

Rather than a substrate, bearing a semiconductor thin film, the invention can be used with a textured superstrate, bearing a semiconductor thin film on the surface that is earthward, obverse of the superstrates sunward surface.

The metallization taught—that of electroless nickel as the contact metal and electroplated copper or silver as the primary conductor, is an exemplary method. Other methods of depositing the contact metal include, but are not limited to the use of organometallic precursor materials as might be practiced with nickel. Alternatively, other metals might be used as the contact material including chromium. Silver can be deposited from organometallic or electroless plating solutions. In the case of silver, the contact metal and the conductor metal can be the same material, although they may be deposited by different methods.

The foregoing has described some processes in which portions of the semiconductor surface are blocked, and then the entire surface is exposed to a reactive material, such as an AR coating etchant. The examples have typically discussed exposing the entire surface in a liquid bath. However, other means for immersion, or complete surface exposure may be used. A liquid bath may be used, and the bath may be aqueous, or non-aqueous (such as alcohol based). The medium may be liquid, or gaseous. Examples of gaseous media include physical vapor deposition (PVD), chemical vapor deposition (CVD) and plasma enhanced chemical vapor deposition (PECVD). Further, rather than a traditional immersive bath, all that is required is that the liquid or gas be provided in a vessel and a volume and flow path such that the entire surface of the textured semiconductor may be brought into contact with the reactive agent for an adequate period of time. The liquid need not be maintained in a vessel. For instance, it can be sprayed on to the article being processed.

It will be understood that an important aspect of some inventions hereof is the use of a texture or topography to localize the action of subsequent fabrication steps. Ideally, the texture itself plays a role in the function of the final device—for example, the roles of light trapping grooves described herein. However, it is possible to provide the texture solely for the purpose of localization of subsequent processing steps. For example, the metallization channels on the back side of the cell can be made the same as those on the front and used for processing, but they need not be as specifically defined for any electrical conduction purposes.

Typically, the localization of subsequent processing steps is achieved primarily through the capillary interaction of a liquid with the surface texture. Capillary interaction means the general branch of physical phenomena that have their origins in the energy of surfaces and the interactions of surfaces. However, it is important to note, that capillarity may play only a minor and even a deminimis role in some embodiments where the texture localizes the action of subsequent fabrication steps.

For example, FIG. 12 shows a textured wafer 1224 which is being subjected to controlled accelerations and deceleration along the direction of the fine gridline channels 1239 as indicated by two headed anew G to help the liquid propagated along their length by making use of the inertia of the liquid column in the gridline channel 1239 to create temporary localized pressures within the liquid. This technique benefits from the fact that generally, it is easier to wet a surface than to de-wet it. Thus, in net, each oscillation of the wafer moves the liquid meniscus forward a small amount, while less or no retraction of the liquid will take place during the opposing motion. Thus, a net wetting advance occurs over time.

In another embodiment, vibrations may be caused in the liquid through the action of sound propagating through the air directed at the liquid.

In another embodiment, electrostatic forces induce motion of the liquid on the surface of the wafer through techniques known as electrowetting. Electric fields influence the surface energies of the interacting materials, thereby changing wetting conditions. Or, electric fields exert body forces on the liquid itself, thereby helping to move it in the channels 1237 of the texture.

In another embodiment, forces induced in or on the liquid by magnetic fields can be used to influence the propagation of the liquid in the intended regions of the texture. For example, particles which respond to magnetic fields may be introduced in the liquid in colloidal suspension or otherwise. Ferromagnetic particles of nickel, iron, iron oxide, cobalt or other materials can be used. Particles of diamagnetic materials such as some forms of graphite and paramagnetic materials such as molybdenum may also be used. Some organometallic liquids are also paramagnetic and thus may be used without the addition of particulate matter.

Thus, an important embodiment of an invention hereof is a method for fabricating a photovoltaic device, comprising: forming a textured semiconductor surface; forming a junction involving the semiconductor; and applying a liquid to a first zone of the surface which liquid migrates within the zone due at least in part to the texture of the surface. The liquid remains excluded from a second zone of the surface that is contiguous with the first zone, the exclusion arising due, at least in part, to the texture of the surface. A chemical reaction is allowed to occur in the first zones.

A related embodiment further comprises applying a metal coating to the semiconductor surface capable of collecting electric power from the semiconductor and further distribution to an electronic system.

In some important embodiments, the liquid migrates within the first zone due at least in part to the influence of capillary attraction, and, in an important class of embodiments, primarily to the influence of capillary attraction. Rather than, or in addition to capillary action, the liquid migrates within the first zone due at least in part to the influence of any one or more of: shaking the substrate, applying sound energy to the liquid, electrowetting and magnetism.

With one very distinctive aspect of an invention hereof, the liquid is a reactive liquid. As such, the method may include the step of creating a chemically modified volume of material comprising an electronic contact with the semiconductor, within the first zone due to the chemical reaction.

According to a very useful embodiment the first zone may be a metallization region of the photovoltaic device. For instance, the first zone may be within a busbar region and within a gridline region. The first zone can also be solely within a busbar region.

Turning to a specific embodiment, the liquid may be an antireflection material. In that case, the first zones is beneficially a light trapping region of the photovoltaic device.

For still another useful embodiment, before the step of applying a liquid to the first zone, the first and second zones of the surface are coated with an antireflection material. Then a liquid is applied that removes the antireflection material. The removal liquid may be a chemical etchant. In such a case, the first and zone can be metallization regions of the photovoltaic device.

In general, the first zones of the surface bears texture that enables the capillary influence.

The semiconducting material can be silicon, and inventions are particularly advantageous with multicrystalline silicon. More generally, the semiconducting material can be p-type, and the step of forming a junction comprises applying as a dopant a phosphorous-bearing chemical. Or, the semiconducting material can be n-type, and the step of forming a junction comprises applying as a dopant a boron-bearing chemical.

The semiconductor being selected from the group consisting of: silicon, germanium and gallium arsenide.

The chemical reaction may be one that forms a metallic coating within the first and second zones of the surface According to other embodiments, the chemical reaction may be a catalyzing reaction with a catalyst that specifically enables the formation of a metallic film by electroless plating within the first zone. Or the chemical reaction may form a metallic coating by electroless plating within the first zone or by using an organometallic material.

Still another embodiment includes treating the textured surface with a material that enhances the flow of liquid under the influence of capillary attraction.

Regarding yet another embodiment, the first zone of the textured surface may comprise at least one channel having a first and a second portion. The at least one channel may be a network of interconnected channels. Or the at least one channel may be a plurality of parallel channels. The surface may further comprise a ridge between a pair of adjacent channels. At least one ridge between a pair of channels may have at least one opening that permits liquid flow therethrough.

An important aspect of an invention hereof has the textured semiconductor surface comprising a thin semiconductor film supported by a textured substrate. Or such a thin film may be supported by a textured superstrate. The superstrate or substrate may be glass.

A related but different embodiment is a method for fabricating a photovoltaic device, comprising: forming a textured semiconductor surface; forming a junction involving the semiconductor; applying a liquid to a first zone of the surface which liquid migrates within the zone due at least in part to the texture of the surface, and which liquid remains excluded from a second zone of the surface that is contiguous with the first zone, the exclusion due at least in part to the texture of the surface; and allowing a chemical reaction to occur in the second zone of the surface.

As above, this method may further comprise applying a metal coating to the semiconductor surface capable of collecting electric power from the semiconductor.

Also, the liquid may migrate within the first zone due at least in part or primarily to the influence of capillary attraction. Or, the migration may be due to the influence of shaking the semiconductor, either by mechanical vibration directly applied through a rigid connection or sound energy applied to the liquid. Also, the influence may be from electrowetting, or applying a magnetic field to the liquid aligned along the direction of migration.

According to this family of embodiments, the liquid that is applied to the first zone is a blocking material. It may, but need not, harden after it migrates. A related embodiment further comprises, before applying the liquid, the step of coating the first and second zones with an antireflection material, wherein the step of applying a blocking material comprises applying a material that protects the antireflection coating against a chemical etchant. The method may additionally include applying to the first and second zones, a removal liquid that removes the antireflection material from zones in which the removal liquid contacts the antireflection material, whereby the antireflection material is removed from the second zone and not removed from the first zone to which the blocking material has been applied. The first zone may be a light trapping region of the photovoltaic device. In that case, the second zone may be a metallization region of the photovoltaic device. The removal liquid may advantageously comprise a chemical etchant.

It is advantageous that the first zone of the surface bears texture that enables the capillary influence.

As with the treating embodiment mentioned recently, the semiconducting material is silicon, for instance multicrystalline. Again, the semiconducting material could be p-type, and the step of forming a junction comprises applying as a dopant a phosphorous-bearing chemical. Or the semiconducting material can be n-type, and the step of forming a junction comprises applying as a dopant a boron-bearing chemical.

A related embodiment, comprises the steps of applying an active, second liquid to the first and second zones, allowing a chemical reaction to take place in the second zone whereby the chemical reaction does not take place in the first zone due to the presence of the blocking material. The second, active liquid may be selected from the group consisting of: antireflective coating solvent; electroless plating catalyst; electroless plating chemistry; and electroplating chemistry. Alternatively, the second, active liquid may be a plurality of liquids, comprising: antireflective coating solvent; electroless plating catalyst; electroless plating chemistry; and electroplating chemistry. If so, the liquids being applied in the sequence listed. For a related embodiment the step of applying the second liquid comprising providing a bath of the second liquid and placing the semiconductor surface into the bath.

Yet another method using a blocking material further comprises the steps of: applying an active, second liquid to the third zone by direct treatment; allowing a chemical reaction to take place in the second zone; whereby the chemical reaction does not take place in the first zone due to the presence of the blocking material. The second, active liquid may be selected from the group consisting of: antireflective coating solvent; electroless plating catalyst; electroless plating chemistry; and electroplating chemistry. Or, the second, active liquid may comprising a plurality of liquids, as mentioned above, in the order listed.

With these blocking methods, also the semiconductor may be selected from the group consisting of: silicon, germanium and gallium arsenide.

Further, the first and second zones of the textured surface may comprise at least one channel having a first and a second portion, which may be a network of interconnected channels, parallels channels, which may have between at least one pair of adjacent channels, a ridge, comprising openings in the ridge that permit liquid flow therethrough.

Additional related embodiments have the steps of removing the blocking material from the first and second zones; applying a second blocking liquid to the first zone of the surface which second blocking liquid migrates within the first zone of the surface, and which second blocking liquid remains excluded from the second zone; and allowing a second chemical reaction to occur in the second zone which reaction is also blocked in the first zone.

It is also possible to apply a second blocking liquid to a third zone of the surface which second blocking liquid migrates within the third zone, which second blocking liquid remains excluded from the second zone of the surface; and allow a second chemical reaction to occur in the second zone which reaction is also blocked in the first, and third zones.

Another class of inventions hereof is a semiconductor body for photovoltaic use comprising a first surface comprising a texture comprising first and second zones, so that any liquid flow pathway that exists to the second zone from the first zone includes a liquid flow impediment feature of the texture. The body may further comprise, within the first zone a network of interconnected channels. The liquid flow impediment comprising an edge or a wall. The network of channels may comprise at least two interconnected metallization region channels. The second zone comprising a light trapping region. The network of channels may be surrounded by an edge that traces a closed loop with the network residing inside the closed loop and with the second zone residing outside of the closed loop. Each of the first and second zones may comprise a network of channels that are surrounded by an edge that traces a closed loop, whereby the first zone is separated from the second zone by an edge that traces a closed loop with first zone residing inside the loop. The network of channels that comprises the first zone may comprise a set of channels, interspersed by ridges. The set of channels may comprise a light trapping region. The second zone may comprise a metallization region. The ridges may comprise openings that permit liquid flow therethrough. A set of channels comprising parallel channels.

Typically, the textured surface comprises a network of channels that are oriented in a way that directs a liquid to migrate within the first zone throughout the network of channels, and not beyond the boundary of the closed loop of the edge. It may be that the semiconductor body of claim 202 and a liquid that presents a contact angle with the semiconducting surface greater than zero and less than ninety degrees the liquid being capable of migrating within the network of channels and being distributed throughout a zone. The liquid is capable of migrating by capillary attraction.

The body may comprise a semiconductor wafer, such as silicon, which may be multicrystalline. It may also be germainium or gallium arsenide. The body may comprise a thin semiconductor film supported by a textured substrate. Or superstrate, either of which may be glass.

An important embodiment further comprises, obverse of the first textured surface on a second side, a second textured surface, comprising a texture comprising obverse first and second zones, so that any liquid flow pathway that exists to the obverse second zone from the obverse first zone includes a liquid flow impediment feature of the texture.

Yet another interesting embodiment is a method for fabricating a photovoltaic device, comprising forming a textured semiconductor surface having a first and second zone; forming a junction involving the semiconductor; applying a first liquid to the first zone of the surface which liquid migrates within the zone, due at least in part to the texture of the textured surface. The liquid remains excluded from a second zone of the surface the exclusion due at least in part to the texture of the surface, the first liquid being a material that prevents secure binding of a subsequent coating to the semiconductor surface. The first and second zones are exposed to a subsequent coating, which subsequent coating adheres strongly to the second zone and weakly to the first zone due to the presence of a coating due to the first liquid. The subsequent coating is removed from the semiconductor. The subsequent coating comprises an antireflection coating. The first liquid may be a spin-on dopant. the subsequent coating may comprise silicon nitride. The first zone may comprise a metallization region of a photovoltaic cell. The second zone may comprise a light trapping region of a photovoltaic cell.

An apparatus of an invention hereof is A photovoltaic device comprising: a semiconductor substrate with at least one textured surface; residing on the at least one textured surface, a plurality of light trapping regions comprising: a plurality of light trapping surface texture features; and an antireflection coating. Residing on the at least one textured surface, adjacent the light trapping regions, are metallization channels, which are separated from an adjacent light trapping region by a fluid flow impediment feature of the textured surface. Within each metallization channel, is an electrode that is electrically connected to the semiconductor substrate and to other electrodes on the at least one textured surface.

The light trapping surface features may comprise a plurality of grooves, which may be parallel or curved. The grooves and the metallization channels may have substantially equal depths. Or the grooves may have depths that are less than depths of the metallization channels. the metallization channels may be busbar channels and gridline channels. The gridline channels may have an aspect ratio of approximately one, and at least greater than 0.1, which is a present standard. At least one of the light trapping features and the metallization channels may have a depth of between approximately 3 μm and approximately 50 μm and preferably of between approximately 5 μm and approximately 20 μm.

There are many variations. The fluid flow impediments may comprise raised edges. The fluid flow impediments may comprise raised edges with lands. The substrate may comprise multicrystalline silicon. The substrate may comprise a semiconductor wafer, a thin film carried on a textured substrate or superstrate, either of which may be glass. The substrate may comprise an n type on p type semiconductor joined by a p/n junction, or a p type semiconductor overlaying n type semiconductor, joined by an n/p junction. The semiconductor may be selected from the group consisting of silicon, germanium and gallium arsenide.

In a related embodiment, the substrate may have a second textured surface, obverse of the first, comprising; a plurality of light deflecting surface texture features; metallization channels; and within at least some of the metallization channels, an electrode.

Yet another embodiment, is also two sided. It is a semiconductor body for photovoltaic use comprising, a first surface comprising a texture comprising first and second zones, so that any liquid flow pathway that exists to the second zone from the first zone includes a liquid flow impediment feature of the texture. Obverse of the first textured surface on a second side, is a second textured surface, comprising a texture comprising obverse first and second zones, so that any liquid flow pathway that exists to the obverse second zone from the obverse first zone includes a liquid flow impediment feature of the texture.

Many techniques and aspects of the inventions have been described herein. The person skilled in the art will understand that many of these techniques can be used with other disclosed techniques, even if they have not been specifically described in use together. For instance the general techniques of treating and blocking have been described. Treating steps can be applied with or without blocking, as described. Blocking may be used to block a region from the action of a material that is provided in a bath or otherwise on the entire device, or by treating. Blocking material may also be an active material for a subsequent or preceding step. Blocking material may be added and removed, and replaced. The flowcharts illustrate steps that may be performed, and possible sequences, although not all possible sequences have been described. However, all sequences shown as possible are intended to be considered as part of an invention hereof. Devices have been described with a zone into which material is provided, within which zone the liquid migrates, and a zone from which material is impeded from migrating. Impediments to liquid flow have been mentioned and illustrated. These impediments have been shown and discussed in connection with specific regimes of blocking, or treating, or blocking and treating. However, any suitable liquid flow impediment may be used with any blocking or treating regime. Further, additional impediments to flow not described, but which function similarly to those described, can be used. Further inventions have been described related to photovoltaic devices in which the texture or topography of a device is used to direct the migration of liquid for processing of the device. It is particularly advantageous when the topography also serves a substantive purpose.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

The invention claimed is:

1. A method for fabricating a photovoltaic device, comprising:
   a. forming a topographically textured semiconductor surface of a semiconductor body;
   b. forming a junction involving the semiconductor body;
   c. applying a liquid to a first zone of the surface which application is guided at least in part by the surface texture, and which liquid remains excluded from a second zone of the surface that is contiguous with the first zone, the exclusion arising due, at least in part, to the surface texture;
   d. allowing a reaction to occur in one of the first zone and the second zone of the surface but not both simultaneously; and
   e. applying a metal coating to the semiconductor surface capable of collecting electric power from the semiconductor and further distribution to an electronic system.

2. A method for fabricating a photovoltaic device, comprising:
   a. forming a topographically textured semiconductor surface of a semiconductor body;
   b. forming a junction involving the semiconductor body;
   c. applying a reactive liquid to a first zone of the surface which application is guided at least in part by the surface texture, and which liquid remains excluded from a second zone of the surface that is contiguous with the first zone, the exclusion arising due, at least in part, to the surface texture; and d. allowing a chemical reaction to occur in one of the first zone and the second zone of the surface but not both simultaneously.

3. The method of claim 2, further comprising the step of creating a chemically modified volume of material comprising an electronic contact with the semiconductor, within the first zone due to the chemical reaction.

4. The method of claim 2, further wherein the first zone comprises a metallization region of the photovoltaic device.

5. The method of claim 4, further wherein the first zone comprises a busbar region of a photovoltaic device and a gridline region of a photovoltaic device.

6. The method of claim 4, further wherein the first zone comprises a gridline region of a photovoltaic device.

7. The method of claim 2, further wherein the chemical reaction forms a metallic coating within the first zone.

8. The method of claim 2, further wherein the chemical reaction is a catalyzing reaction with a catalyst that specifically enables the formation of a metallic film by electroless plating within the first zones.

9. The method of claim 2, further wherein the chemical reaction forms a metallic coating by electroless plating within the first zone.

10. The method of claim 2, further wherein the chemical reaction forms a metallic coating within the first zone using an organometallic material.

11. A method for fabricating a photovoltaic device, comprising:
   a. forming a topographically textured semiconductor surface of a semiconductor body; the semiconductor being selected from the group consisting of: silicon, germanium and gallium arsenide;
   b. forming a junction involving the semiconductor body;
   c. applying a liquid to a first zone of the surface which application is guided at least in part by the surface texture, and which liquid remains excluded from a second zone of the surface that is contiguous with the first zone, the exclusion arising due, at least in part, to the surface texture; and
   d. allowing a reaction to occur in one of the first zone and the second zone of the surface but not both simultaneously.

12. A method for fabricating a photovoltaic device, comprising:
   a. forming a topographically textured semiconductor surface of a semiconductor body;
   b. forming a junction involving the semiconductor body;
   c. applying a liquid to a first zone of the surface, the first zone of the textured surface comprising at least one channel having a first and a second portion, which application is guided at least in part by the surface texture, and which liquid remains excluded from a second zone of the surface that is contiguous with the first zone, the exclusion arising due, at least in part, to the surface texture; and
   d. allowing a reaction to occur in one of the first zone and the second zone of the surface but not both simultaneously.

13. A method for fabricating a photovoltaic device, comprising:
   a. forming a topographically textured semiconductor surface of a semiconductor body; the textured semiconductor surface comprising a thin semiconductor film supported by a textured substrate body;
   b. forming a junction involving the semiconductor body;
   c. applying a liquid to a first zone of the surface which application is guided at least in part by the surface texture, and which liquid remains excluded from a second zone of the surface that is contiguous with the first zone, the exclusion arising due, at least in part, to the surface texture; and
   d. allowing a reaction to occur in one of the first zone and the second zone of the surface but not both simultaneously.

14. A method for fabricating a photovoltaic device, comprising:
   a. forming a topographically textured semiconductor surface of a semiconductor body;
   the textured semiconductor surface comprising a thin semiconductor film supported by a textured superstrate body;
   b. forming a junction involving the semiconductor body;
   c. applying a liquid to a first zone of the surface which application is guided at least in part by the surface texture, and which liquid remains excluded from a second zone of the surface that is contiguous with the first zone, the exclusion arising due, at least in part, to the surface texture; and
   d. allowing a reaction to occur in one of the first zone and the second zone of the surface but not both simultaneously.

15. The method of claim 14, the superstrate comprising a glass.

16. The method of claim 13, the substrate comprising a glass.

17. A method for fabricating a photovoltaic device, comprising:
   a. forming a topographically textured semiconductor surface of a semiconductor body;
   b. forming a junction involving the semiconductor body;
   c. applying a blocking material liquid to a first zone of the surface which application is guided at least in part by the surface texture, and which liquid remains excluded from a second zone of the surface that is contiguous with the first zone, the exclusion arising due, at least in part, to the surface texture; and
   d. allowing a chemical reaction to occur in the second zone.

18. The method of claim 17, further wherein the blocking material hardens after it is applied.

19. The method of claim 17, further comprising before the step of applying a liquid, the step of coating the first and second zones with an antireflection material, wherein the step of applying a blocking material comprises the step of applying a material that protects the antireflection coating against a chemical etchant.

* * * * *